(12) United States Patent
Ishikura

(10) Patent No.: US 7,203,085 B2
(45) Date of Patent: Apr. 10, 2007

(54) SEMICONDUCTOR INTEGRATED CIRCUIT

(75) Inventor: Satoshi Ishikura, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 124 days.

(21) Appl. No.: 11/073,738

(22) Filed: Mar. 8, 2005

(65) Prior Publication Data

US 2005/0201181 A1 Sep. 15, 2005

(30) Foreign Application Priority Data

Mar. 10, 2004 (JP) .............................. 2004-068070

(51) Int. Cl.
*G11C 5/06* (2006.01)

(52) U.S. Cl. ........................................ 365/63; 257/758

(58) Field of Classification Search ................ 257/758, 257/207, 208

See application file for complete search history.

(56) References Cited

U.S. PATENT DOCUMENTS 6,339,541 B1 * 1/2002 Hardee et al. ................ 365/63

6,477,100 B2 11/2002 Takemura et al.
2004/0251535 A1 * 12/2004 Nagata et al. .............. 257/691

FOREIGN PATENT DOCUMENTS

JP 2004-024378 1/2004

* cited by examiner

*Primary Examiner*—Amir Zarabian
*Assistant Examiner*—Kretelia Graham
(74) *Attorney, Agent, or Firm*—McDermott Will & Emery LLP

(57) ABSTRACT

First and second internal power source lines supply first and second voltages to an internal circuit, respectively. A first line 31 and a second line 32 are arranged parallel to the first and the second internal power source lines in a layer above the layer in which the first and the second internal power source lines are arranged. Third lines 33 extend in a direction perpendicular to the first line in a layer above the layer in which the first and the second internal power source lines are present. Fourth lines 34 extend in a direction perpendicular to the second line in a layer above the layer in which the first and the second internal power source lines are present. The first, and the third and the first internal power source lines are connected, and the second, and the fourth and the second internal power source lines are connected.

18 Claims, 18 Drawing Sheets

F I G. 5
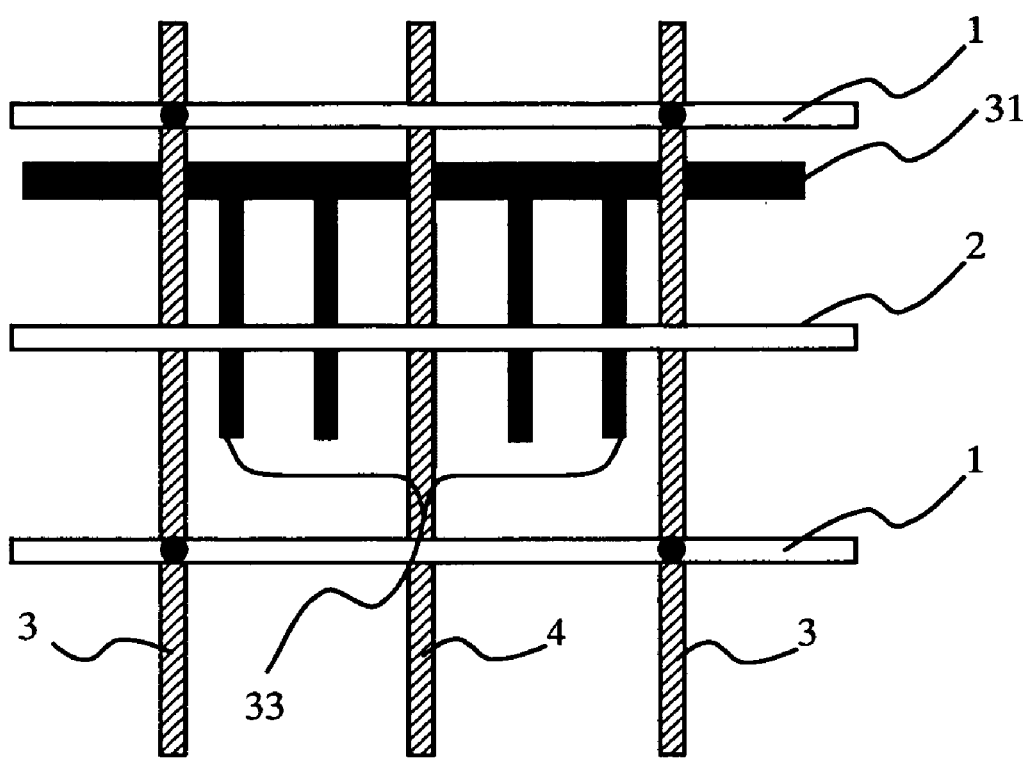

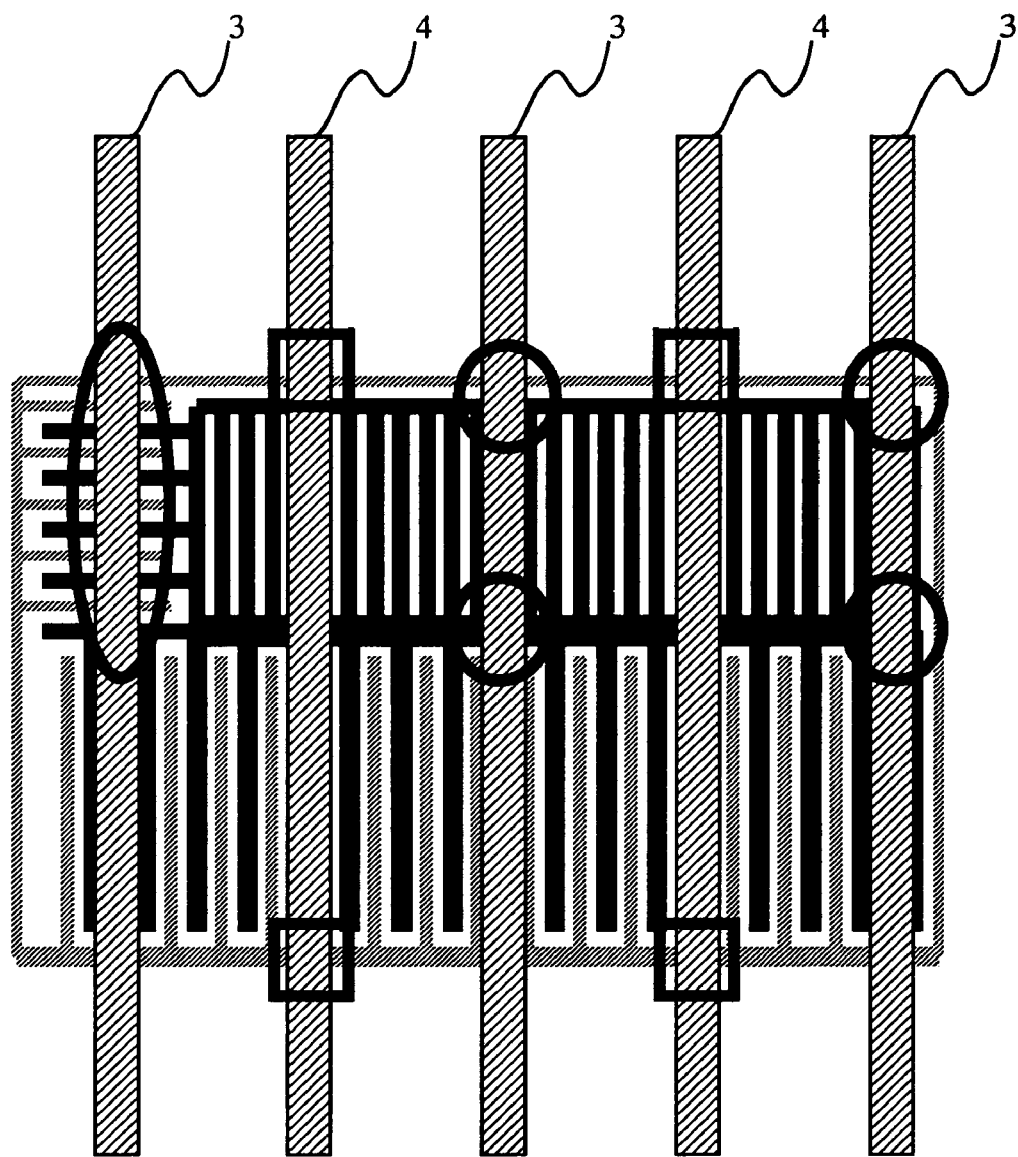
F I G. 6

F I G. 7
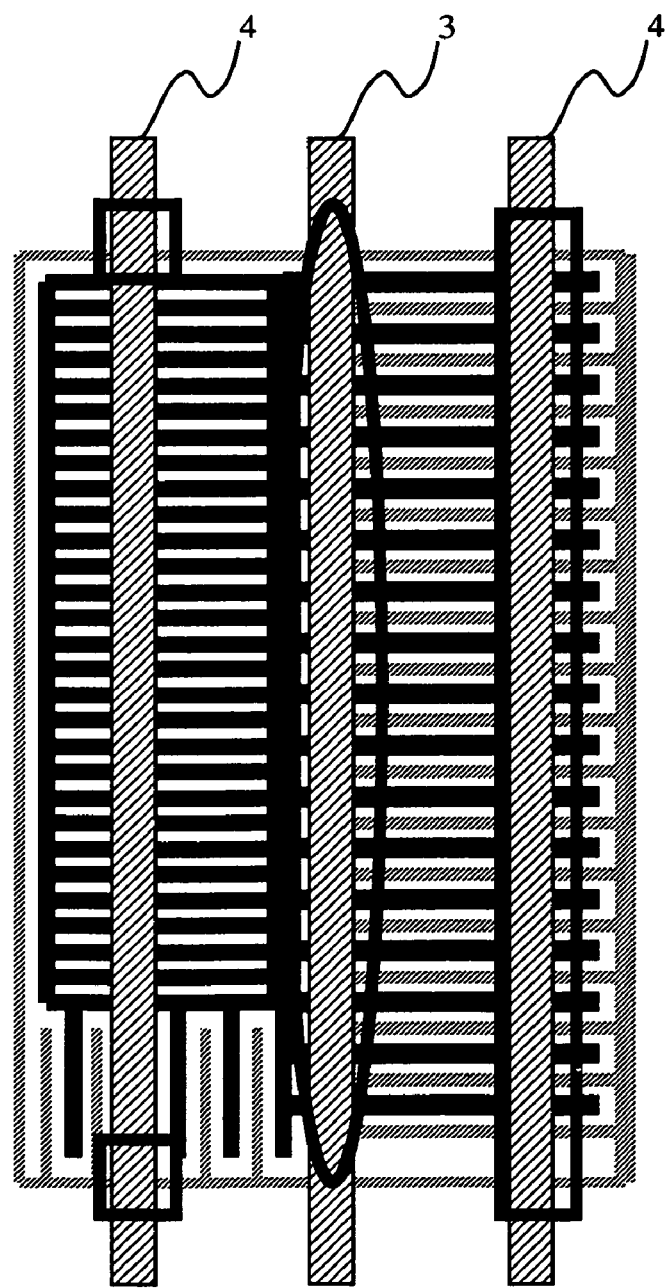

F I G. 1 5 Prior Art
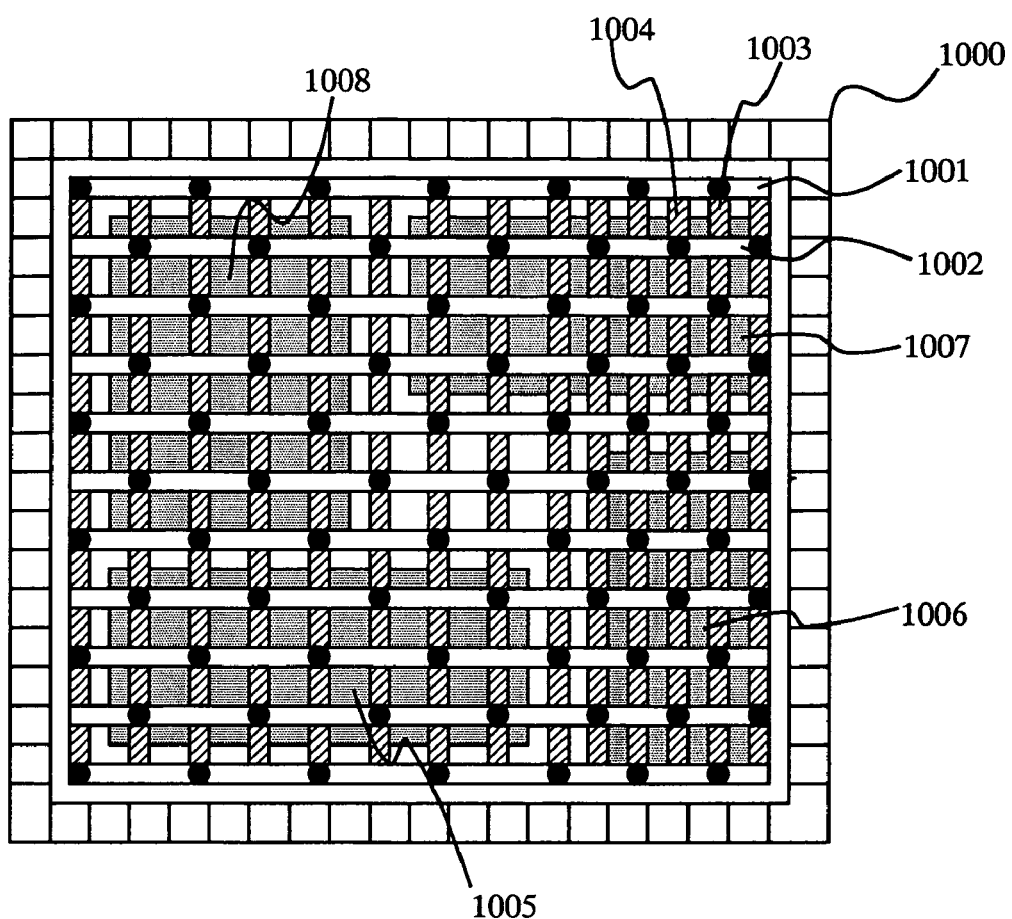

F I G. 1 6  Prior Art
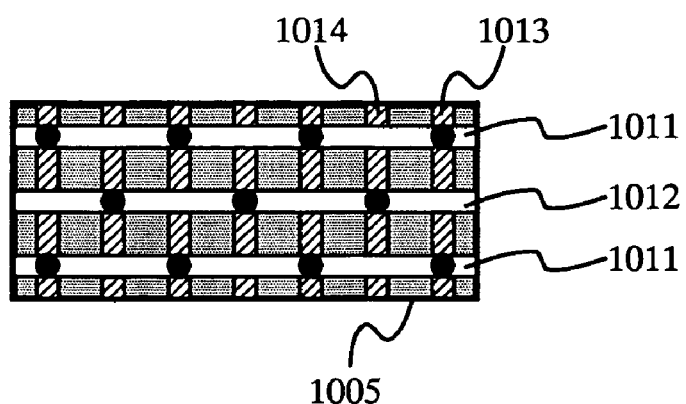
F I G. 1 7  Prior Art
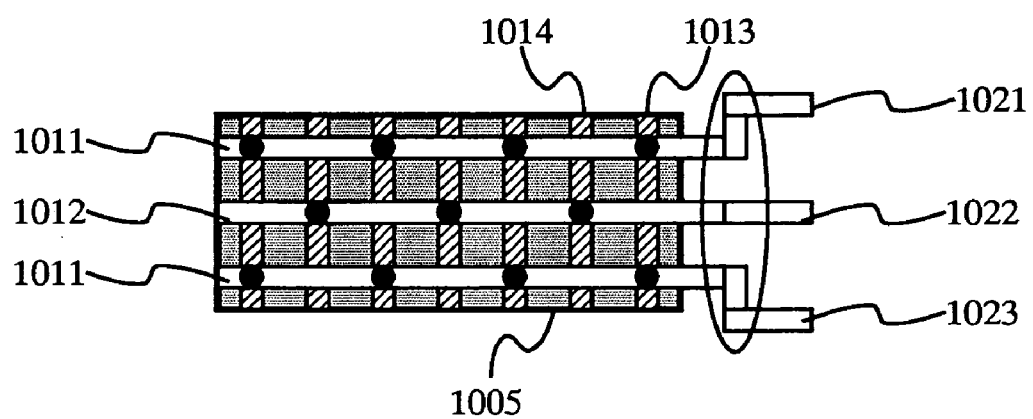

SEMICONDUCTOR INTEGRATED CIRCUIT

BACKGROUND OF THE INVENTION

1. Field of the Invention

The present invention relates to a semiconductor device. More specifically, the present invention relates to a semiconductor device that is incorporated in a portion of a semiconductor integrated circuit in which a plurality of first power source lines to which a first voltage is applied and a plurality of second power source lines to which a second voltage is applied are arranged in a lattice.

2. Description of the Background Art

FIG. 15 is a diagram showing the configuration of a conventionally common semiconductor chip. A semiconductor chip 1000 shown in FIG. 15 has a six-layered line structure, and includes a sixth layer VSS power source line (hereinafter, referred to as "M6VSS line") 1001, a sixth layer VDD power source line (hereinafter, referred to as "M6VDD line") 1002, a fifth layer VSS power source line (hereinafter, referred to as "M5VSS line") 1003, a fifth layer VDD power source line (hereinafter, referred to as "M5VDD line") 1004, a memory circuit 1005, a logic circuit 1006, a logic circuit 1007, and a functional block circuit 1008. The black circles in FIG. 15 denote contacts. The memory circuit 1005, the logic circuit 1006, the logic circuit 1007, and the functional block circuit 1008 are collectively called "a semiconductor device". The M5VSS line 1003, the M5VDD line 1004, the M6VSS line 1001, and the M6VDD line 1002 are collectively called "power source lines in the fifth and sixth layers".

The semiconductor device is formed from the first to the fourth layers. The M5VSS line 1003 and the M5VDD line 1004 are basically arranged alternately in the fifth layer while extending in the column direction. The M6VSS line 1001 and the M6VDD line 1002 are basically arranged alternately in the sixth layer while extending in the row direction. The M6VSS line 1001 and the M5VSS line 1003 supply a ground voltage VSS to the semiconductor chip 1000. The M6VDD line 1002 and the M5VDD line 1004 supply a power source voltage VDD to the semiconductor chip 1000. In the semiconductor chip 1000 shown in FIG. 15, the semiconductor device formed in the fourth layer and the layers beneath is designed, and then the power source lines in the fifth and sixth layers are designed.

In recent years, libraries of circuits including a semiconductor device and a portion of power source lines (hereinafter, referred to as "modules") are created in order to facilitate the design of a semiconductor chip. In a circuit design using modules from circuit libraries, modules of a plurality of patterns that are designed in advance are combined so that a semiconductor chip is designed. Hereinafter, a circuit library of modules will be described with reference to the accompanying drawings. FIG. 16 is a diagram showing the configuration of a module including a memory circuit as an example of the module from circuit libraries.

The module shown in FIG. 16 is a circuit designed from the first layer to sixth layer, and includes a memory circuit 1005, an M6VSS line 1011, an M6VDD line 1012, an M5VSS line 1013, and an M5VDD line 1014. In circuit design using modules from circuit libraries, a plurality of module as shown in FIG. 16 are arranged. Thereafter, power source lines for connecting power source lines between the plurality of modules are arranged. In this manner, a semiconductor chip is designed. Thus, using modules from circuit libraries, it is not necessary to design each module from the scratch, and thus the design of a semiconductor chip is facilitated.

However, in the circuit design using modules from circuit libraries, it is necessary to design the power source lines in the fifth and sixth layers in accordance with the arrangement of the modules. Hereinafter, this problem will be described with reference to the accompanying drawing. FIG. 17 is a diagram showing the state in which the module shown in FIG. 16 is connected to power source lines around the periphery of this module.

Since the module is a circuit that is designed in advance, the power source lines included in the module are arranged with a predetermined gap. On the other hand, the gap between the power source lines around the periphery of the module is varied, depending on the kind of the module included in a semiconductor chip, and therefore it is not constant. Therefore, when the gap between the power source lines included in the module is different from that between the power source lines around the periphery of the module, guiding portions as shown by the elliptical portion in FIG. 17 are necessary in order to connect these power source lines. That is to say, it is necessary to design the guiding portions in accordance with the gap between the power source lines of the module.

In order to solve this problem, a semiconductor device as shown in FIG. 18 is presented. FIG. 18 is a diagram showing the configuration of a semiconductor device including a memory circuit. Hereinafter, a circuit design using the semiconductor device as shown in FIG. 18 as the module will be described.

The semiconductor device shown in FIG. 18 includes a memory circuit 1005, a fourth layer VSS line (hereinafter, referred to as "M4VSS line") 1041, a fourth layer VDD line (hereinafter, referred to as "M4VDD line") 1042, a third layer VDD power source line (hereinafter, referred to as "M3VDD line") 1043, and a third layer VSS power source line (hereinafter, referred to as "M3VSS line") 1044. The memory circuit 1005 is formed from the first to the fourth layers. The M4VSS line 1041, the M4VDD line 1042, the M3VDD line 1043 and the M3VSS line 1044 are formed in the third and the fourth layers, and supply a power source voltage VDD and a ground voltage VSS. That is to say, the semiconductor device shown in FIG. 18 is a circuit in which a portion from the first layer to the fourth layer is designed. The voltages supplied from the M4VSS line 1041, the M4VDD line 1042, the M3VDD line 1043 and the M3VSS line 1044 are supplied to the memory circuit 1005 through the lines (not shown) in the third layer and the layers beneath.

In the circuit design in which the semiconductor device shown in FIG. 18 is used as the module, semiconductor devices, which are the modules, are arranged in a semiconductor chip. Thereafter, power source lines in the fifth and sixth layers are arranged. Thus, the semiconductor chip 1000 as shown in FIG. 19 is completed. In the semiconductor device shown in FIG. 18, power source lines extending in the horizontal direction and the vertical direction are arranged in a portion around the periphery of the memory circuit 1005 in the third and fourth layers. Therefore, the power source lines in the fifth and sixth layers extending in the horizontal direction cross the power source lines in the third and fourth layers extending in the vertical direction, even if the gap between the power source lines is changed. Similarly, the power source lines in the fifth and sixth layers extending in the vertical direction cross the power source lines in the third and fourth layers extending in the horizontal direction, even if the gap between the power source lines is changed. Consequently, it is not necessary to design the power source lines in the fifth and sixth layers in accordance with the power source lines in the semiconductor device that is the module.

However, in the semiconductor device shown in FIG. 18, the power source lines in the third and fourth layers are arranged around the periphery of the memory circuit 1005, and therefore, the chip area of the semiconductor device is increased. To cope with this problem, it can be conceived to arrange the power source lines in the third and fourth layers above the memory circuit 1005, as shown in FIG. 20. However, the power source lines in the third and fourth layers cannot be arranged above the memory circuit 1005 for the following reason.

FIG. 21 is a block diagram showing the configuration of the memory circuit 1005. The memory circuit 1005 shown in FIG. 21 includes a memory cell area 1050, a data input/output portion 1051, a row decoder portion 1052, and a control portion 1053. In the data input/output portion 1051, the third layer VSS line and the third layer VDD line extending in the row direction shown by an arrow in FIG. 21 are present. In the row decoder portion 1052, the third layer VSS line and the third layer VDD line extending in the column direction shown by an arrow in FIG. 21 are present. In order to connect the power source lines in the memory circuit 1005 and the power source lines around the periphery of the memory circuit 1005, a connection as shown in FIG. 22 has to be performed. Hereinafter, a method for connecting these power source lines will be described with reference to FIG. 22. FIG. 22 is a diagram showing an enlarged portion α in FIG. 21.

In FIG. 22, a M4VSS line 1041 extending in the row direction and a M3VSS line 1066 extending in the column direction are connected via contacts. The M3VSS line 1066 extending in the column direction and a M4VSS line 1064 extending in the column direction are connected via contacts. The M4VSS line 1064 extending in the column direction and a M3VSS line 1062 extending in the row direction are connected via contacts. Thus, a ground voltage VSS is supplied from the M4VSS line 1041 to the M3VSS line 1062.

Similarly, a M4VDD line 1042 extending in the row direction and a M3VDD line 1065 extending in the column direction are connected via contacts. The M3VDD line 1065 extending in the column direction and a M4VDD line 1063 extending in the column direction are connected via contacts. The M4VDD line 1063 extending in the column direction and a M3VDD line 1061 extending in the row direction are connected via contacts. Thus, a power source voltage VDD is supplied from the M4VDD line 1042 to the M3VDD line 1061.

In order to supply the ground voltage VSS of the M4VSS line 1041 disposed outside the M4VDD line 1042 to the M3VSS line 1062 in the memory circuit 1005, the M3VSS line 1066 for extending below the M4VDD line 1042 is necessary. The M3VSS line 1066 is formed in the third layer, which is the same layer as the M3VDD line 1061 and the M3VSS line 1062 in the memory circuit 1005. As a result, as shown in FIG. 20, when the M4VSS line 1041 and the M4VDD line 1042 are arranged above the memory circuit 1005 in order to reduce the size of the semiconductor device, the M3VSS line 1066 cannot be formed.

SUMMARY OF THE INVENTION

Therefore, an object of the present invention is to provide a semiconductor device having a high degree of freedom for design of power source lines arranged in a layer above the semiconductor device and a small chip area.

A semiconductor device of the present invention is a semiconductor that is incorporated into a portion of a semiconductor integrated circuit in which a plurality of first power source lines to which a first voltage is applied and a plurality of second power source lines to which a second voltage is applied are arranged in a lattice. An internal circuit is disposed in a layer below the first and the second power source lines and operates with the first and the second voltages supplied. At least one first internal power source line is arranged parallel to each other in a layer between a layer in which the first power source lines are arranged and a layer in which the internal circuit is disposed in order to supply the first voltage to the internal circuit. At least one second internal power source line is arranged parallel to the first internal power source lines in a same layer as the first internal power source lines in order to supply the second voltage to the internal circuit. First and second lines are arranged parallel to the first and the second internal power source lines in a layer between the layer in which the first and the second internal power source lines are arranged and the layer in which the first and the second power source lines are arranged. A plurality of third lines are connected to the first line and extend in a direction perpendicular to the first line in a layer above an area in which the first and the second internal power source lines are present. A plurality of fourth lines that are connected to the second line and extend in a direction perpendicular to the second line in a layer above the area in which the first and the second internal power source lines are present. The first line, the third lines and the first internal power source lines are electrically connected. The second line, the fourth lines and the second internal power source lines are electrically connected.

In a memory cell area, a plurality of memory cells are arranged in a matrix. The internal, circuit may include a peripheral circuit for writing and reading data in/from the memory cells.

The peripheral circuit may include an input/output circuit for inputting/outputting data with respect to the memory cells, a row decoder circuit for selecting memory cells in the memory cell area row by row, and a control circuit for controlling the input/output circuit and the row decoder circuit.

The line width of the first line disposed in a layer above an area in which the input/output circuit is present may be larger than that of the first line disposed in a layer above an area in which the row decoder circuit and the memory cell area are present.

The line width of the second line disposed in a layer above a vicinity of a boundary area between the input/output circuit and the memory cell area may be larger than that of the second line disposed in a layer above an area in which the row decoder circuit and the memory cell area are present.

The first line may be disposed in a layer above an area in which the input/output circuit is present, and is connected to the first internal power source lines via contacts.

The gap between the first power source lines may be smaller than the shortest line of the third line disposed in the input/output circuit, the fourth line disposed in the input/output circuit, the fourth line disposed in the control circuit, and the third line disposed in the row decode circuit.

The gap between the second power source lines may be smaller than the shortest line of the third line disposed in the input/output circuit, the fourth line disposed in the input/output circuit, the fourth line disposed in the control circuit, and the third line disposed in the row decode circuit.

The first voltage may be a power source voltage and the second voltage is a ground voltage.

The first line may be disposed near an outer circumference of an area obtained by combining the peripheral circuit and the memory cell area. A P-channel transistor may be formed in an area near an outer circumference of the peripheral circuit. An N-channel transistor may be formed in an area inside the area in which the P-channel transistor is formed. The first line may be disposed in a layer above the area in which the P-channel transistor is formed. The second line may be disposed in a layer above the area in which the N-channel transistor is formed.

The semiconductor device may further include a plurality of lines for memory cells extending in parallel to each other in a direction perpendicular to the second line in a layer above the memory cell area.

The first power source lines and the first line may be electrically connected at at least one point in which they cross each other when a semiconductor chip is projected from above. The second power source lines and the second line may be electrically connected at at least one point in which they cross each other when the semiconductor chip is projected from above.

The first power source lines and the second power source lines may be arranged parallel to each other and alternately, and a length of the third lines may be larger than a gap between the first power source lines that are adjacent with the second power source line interposed therebetween.

The first power source lines and the second power source lines may be arranged parallel to each other and alternately, and a length of the fourth lines may be larger than a gap between the second power source lines that are adjacent with the first power source line interposed therebetween.

The first power source lines and the second power source lines may be arranged parallel to each other and alternately, and a length of the first line may be larger than a gap between the first power source lines that are adjacent with the second power source line interposed therebetween.

The first power source lines and the second power source lines may be arranged parallel to each other and alternately, and a length of the second line may be larger than a gap between the second power source lines that are adjacent with the first power source line interposed therebetween.

The third lines and the fourth lines may be arranged parallel to each other and alternately.

The semiconductor device of the present invention may further include at least one signal line arranged parallel to the first and the second internal power source lines near an end portion of the first and the second internal power source lines in a same layer as a layer in which the first and the second internal power source lines are arranged, and a fifth line that is parallel to the first line and is connected to the third lines, the fifth line being in a layer above the area in which the signal line is present.

The present invention is directed not only to the semiconductor device, but also a method for generating a layout of a semiconductor integrated circuit to which the semiconductor is applied.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram showing the positional relationship between the power source lines in the fifth and sixth layers and the power source lines in the fourth layer;

FIG. 6 is a diagram showing the connection relationship between the power source lines in the fifth layer and the power source lines in the fourth layer;

FIG. 7 is a diagram showing the connection relationship between the power source lines in the fifth layer and the power source lines in the fourth layer;

FIG. 15 is a diagram showing the configuration of a conventionally common semiconductor chip;

FIG. 16 is a diagram showing the configuration of a module including a memory circuit as an example of a module from circuit libraries;

FIG. 17 is a diagram showing the manner in which the module shown in FIG. 16 is connected to power source lines around the periphery of the module;

DESCRIPTION OF THE PREFERRED EMBODIMENTS

Figure 1:
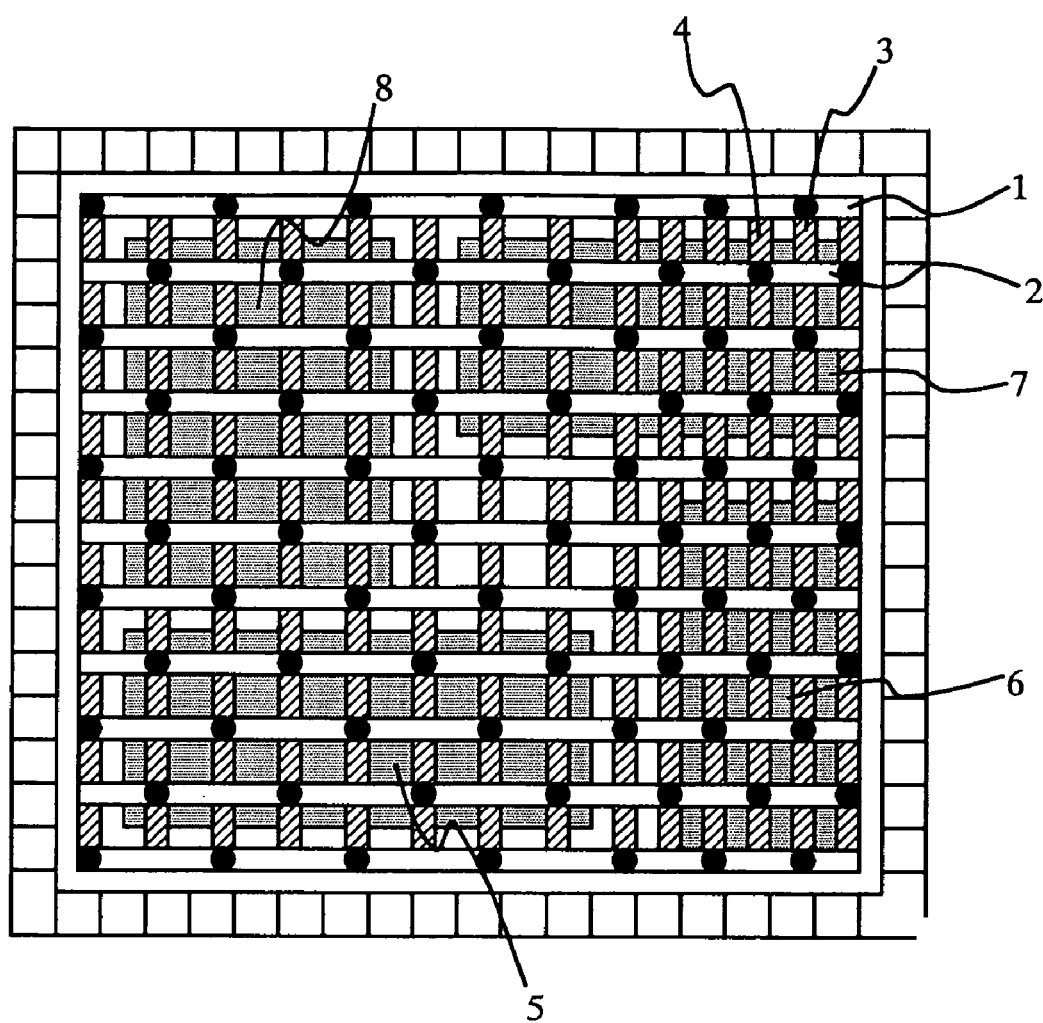
FIG. 1 is a diagram showing the configuration of a semiconductor chip including a semiconductor device of the present invention.

Hereinafter, a semiconductor device of one embodiment of the present invention will be described with reference to the accompanying drawings. This embodiment will be described, taking a memory circuit as the semiconductor device. FIG. 1 is a diagram showing the configuration of a semiconductor chip including the semiconductor device of this embodiment.

A semiconductor chip shown in FIG. 1 has a six-layered line structure, and includes a sixth layer VSS power source line (hereinafter, referred to as "M6VSS line") 1, a sixth layer VDD power source line (hereinafter, referred to as "M6VDD line") 2, a fifth layer VSS power source line (hereinafter, referred to as "M5VSS line") 3, a fifth layer VDD power source line (hereinafter, referred to as "M5VDD line") 4, a memory circuit 5, a logic circuit 6, a logic circuit 7, and a functional block circuit 8. The black circles in FIG. 1 denote contacts for connecting the lines in the fifth layer and the lines in the sixth layer. The memory circuit 5, the logic circuit 6, the logic circuit 7, and the functional block circuit 8 are collectively called "a semiconductor device". That is to say, the semiconductor device of this embodiment can be applied to a circuit other than the memory circuit 5.

In the semiconductor chip shown in FIG. 1, in order to supply a power source voltage to the semiconductor device in the chip without the power source voltage being dropped, the lines in the fifth layer and the sixth layer are arranged in a lattice. More specifically, the M5VSS line 3 and the M5VDD line 4 are arranged in the fifth layer alternately while extending in the column direction. The M6VSS line 1 and the M6VDD line 2 are arranged in the sixth layer alternately while extending in the row direction. The M6VSS line 1 and the M5VSS line 3 supply a ground voltage VSS to the semiconductor chip. The M6VDD line 2 and the M5VDD line 4 supply a power source voltage VDD to the semiconductor chip. Hereinafter, lines for supplying the ground voltage VSS or the power source voltage VDD are referred to as "power source lines".

Figure 2:
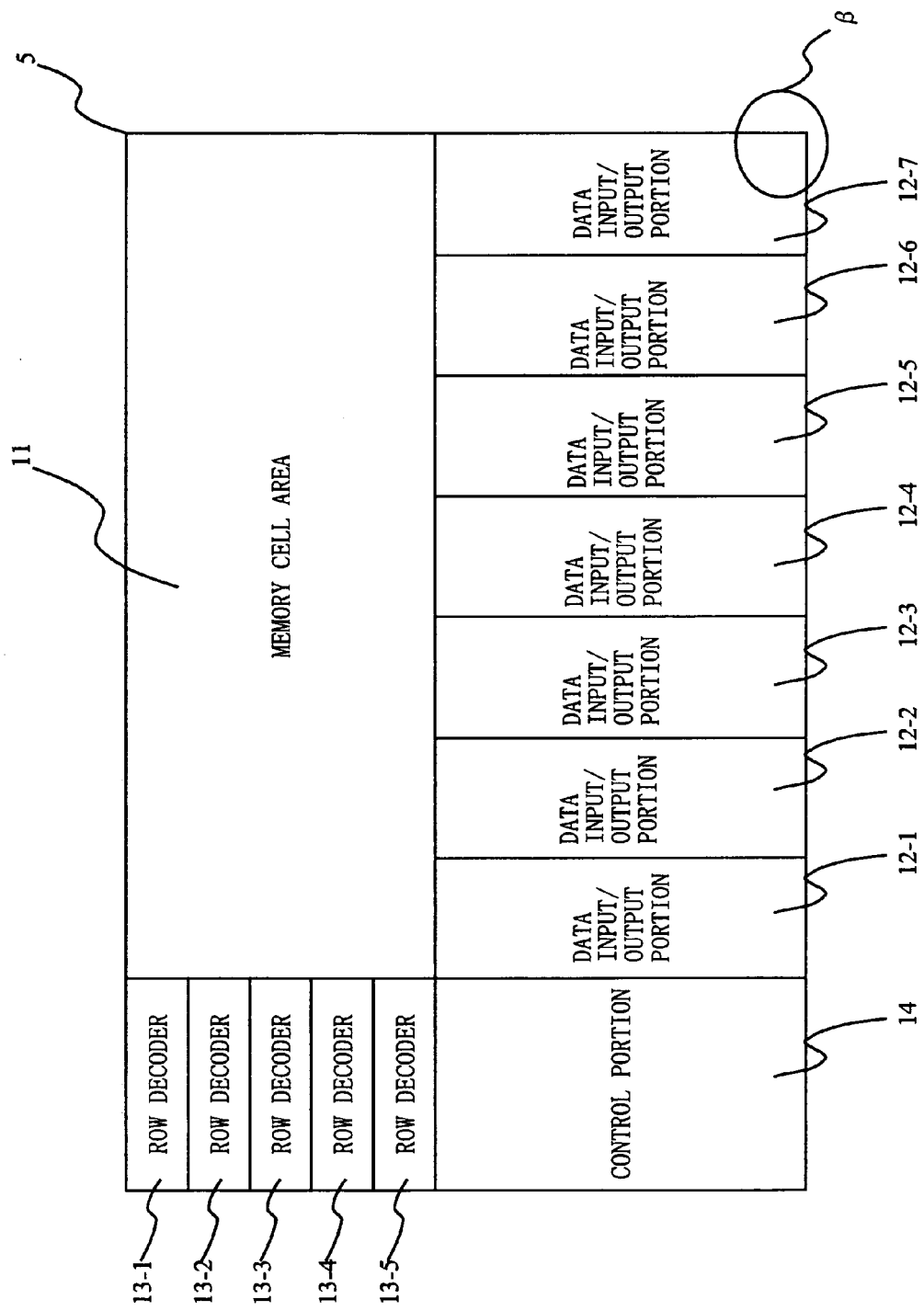
FIG. 2 is a block diagram showing the function of each portion in a memory circuit 5.

In the semiconductor chip shown in FIG. 1, the semiconductor device is formed from the first to the fourth layers. The semiconductor device will be described in detail below. Herein, the memory circuit 5 will be described in detail as a typical example of the semiconductor device. FIG. 2 is a block diagram showing the function of each portion in the memory circuit 5.

As shown in FIG. 2, the memory circuit 5 is realized, for example, by SRAM, and includes a memory cell area 11, data input/output portions 12-1 to 12-7, row decoders 13-1 to 13-5 and a control portion 14 in lower layers (specifically, the first and the second layers). In the memory cell area 11, a plurality of memory cells are arranged in a matrix, and this is an area for storing data. The row decoders 13-1 to 13-5 are circuits for selecting a word line (not shown) extending in the row direction in the memory cell area 11 in order to select memory cells row by row. The row decoders 13-1 to 13-5 are arranged in a line in the column direction. The data input/output portions 12-1 to 12-7 are circuit for writing and reading data in/from memory cells. The data input/output portions 12-1 to 12-7 are arranged in a line in the row direction. In FIG. 2, the numbers of the data input/output portions 12 and the row decoders 13 are much smaller than the actual numbers for the sake of clarity in the drawing.

Figure 3:
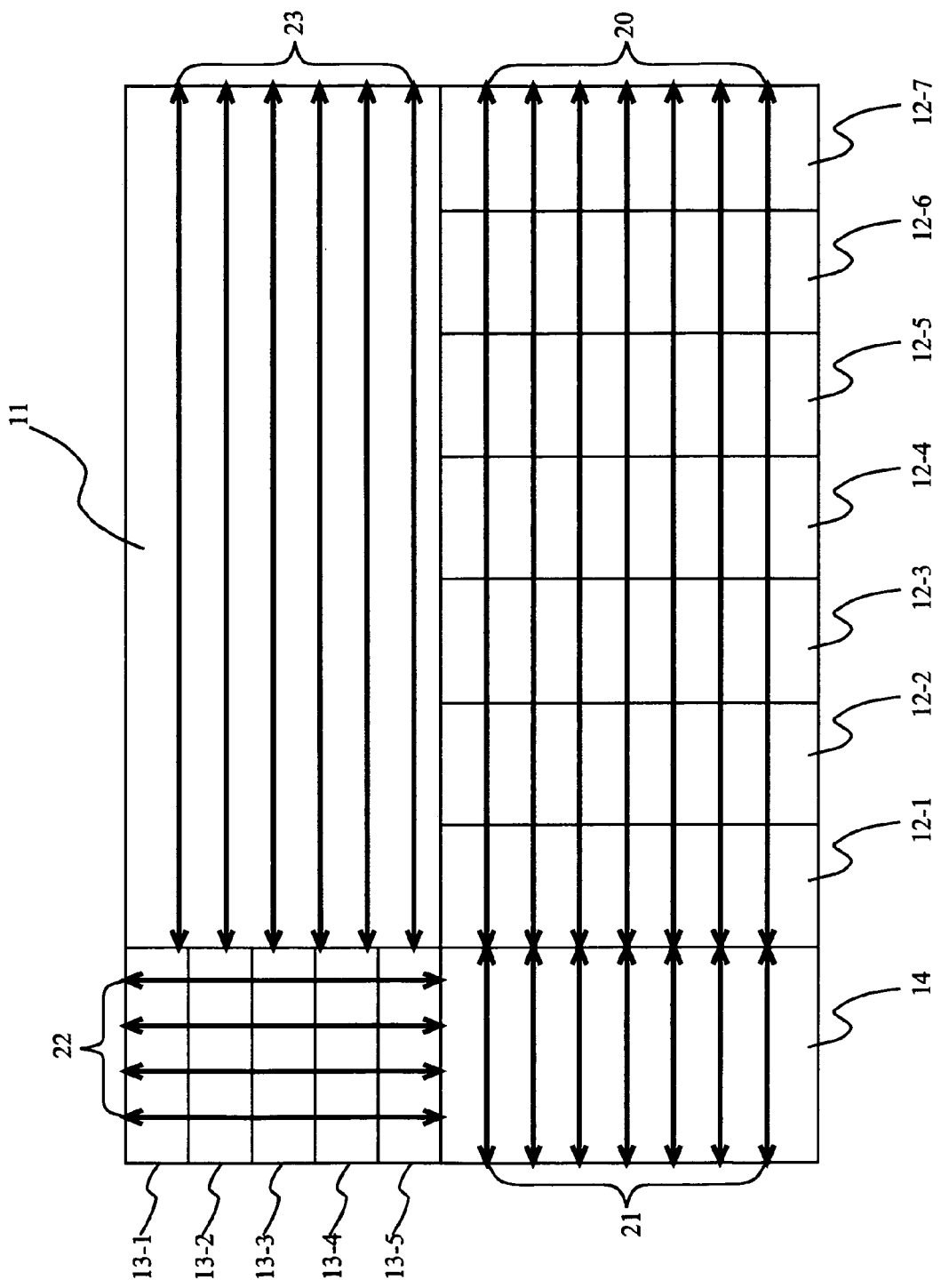
FIG. 3 is a diagram showing an example of power source lines and signal lines arranged in the third layer of the memory circuit 5.

Herein, the power source lines for supplying the power source voltage VDD and the ground voltage VSS to each component portion formed in the lower layers of the memory circuit 5 shown in FIG. 2 will be described with reference to the accompanying drawings. FIG. 3 is a diagram showing the state of the power source lines arranged in the third layer of the memory circuit 5.

The bold arrows in FIG. 3 denote the direction in which the power source lines in the third layer of the memory circuit 5 are arranged. A plurality of power source lines 23 for supplying the ground voltage VSS to the memory cell area 11 are arranged in the row direction above the area in which the memory cell area 11 is disposed. A plurality of power source lines 20 for supplying the ground voltage VSS and the power source voltage VDD to the data input/output portions 12-1 to 12-7 are arranged in the row direction above the area in which the data input/output portions 12-1 to 12-7 are arranged. A plurality of power source lines 21 for supplying the ground voltage VSS and the power source voltage VDD to the control portion 14 are arranged in the row direction above the area in which the central portion 14 is disposed. A plurality of power source lines 22 for supplying the ground voltage VSS and the power source voltage VDD to the row decoders 13-1 to 13-5 are arranged in the column direction above the area in which the row decoders 13-1 to 13-5 are arranged.

Figure 4:
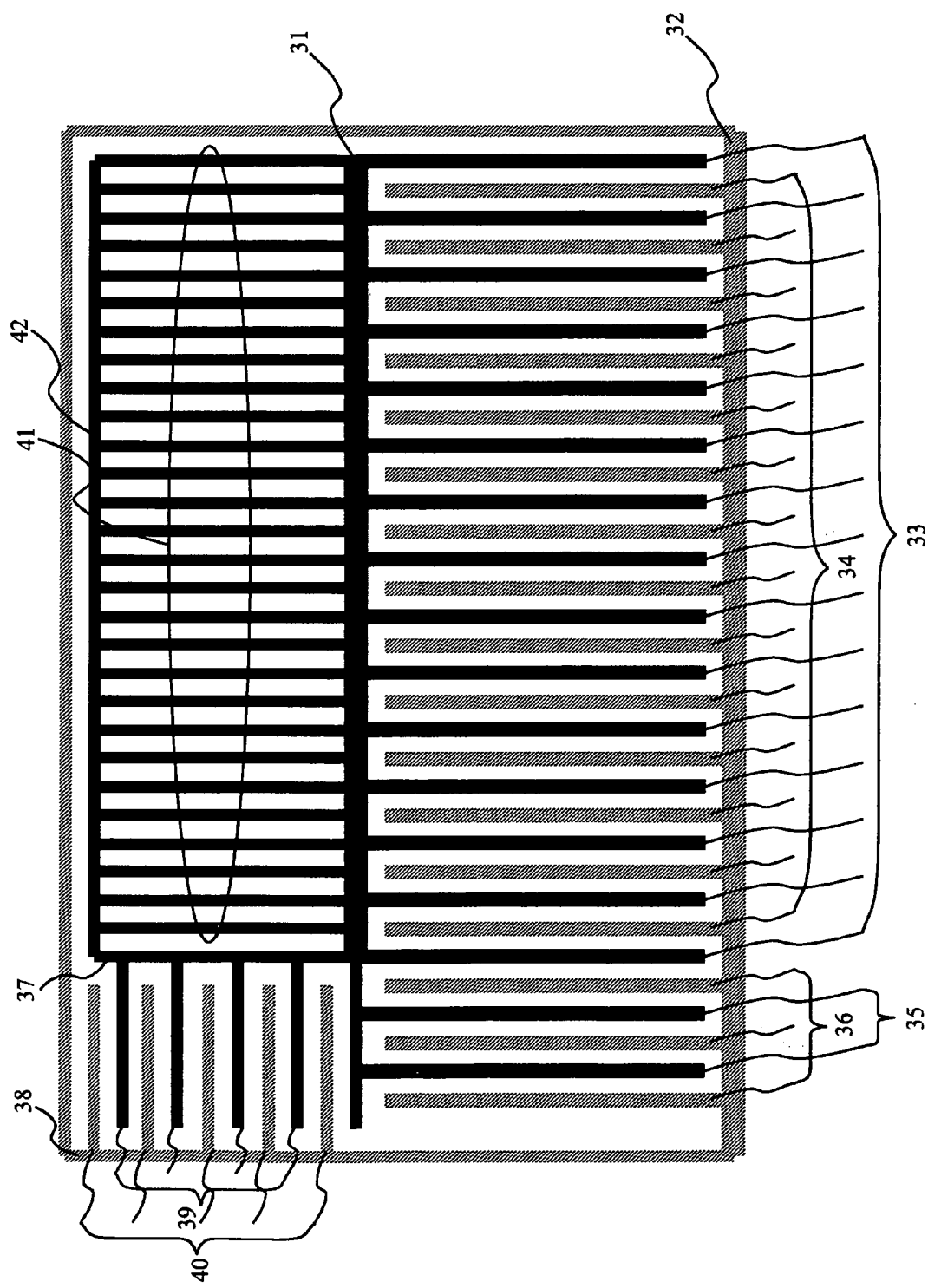
FIG. 4 is a diagram showing the state of the power source lines in the fourth layer of the memory circuit 5.

Next, the line structure in the fourth layer of the memory circuit 5, which is a characteristic portion of this invention, will be described with reference to FIG. 4. FIG. 4 is a diagram showing the state of the power source lines in the fourth layer of the memory circuit 5.

The power source lines in the fourth layer shown in FIG. 4 are lines for mediating an electrical connection between the power source lines in the fifth layer shown in FIG. 1 and the power source lines in the third layer shown in FIG. 3. Therefore, the power source lines in the fourth layer are connected to both the power source lines in the fifth layer and the power source lines in the third layer via contacts. The power source lines in the fourth layer include power source lines for supplying the ground voltage VSS (black lines in FIG. 4) and power source lines for supplying the power source voltage VDD (gray lines in FIG. 4). The power source lines for supplying the ground voltage VSS include a VSS main power source line 31, VSS sub-power source lines 33, VSS sub-power source lines 35, a VSS main power source line 37, VSS sub-power source lines 39, VSS power source lines 41 for memories and a VSS power source line 42 for memories. The power source lines for supplying the power source voltage VDD include a VDD main power source line 32, VDD sub-power source line 34, VDD sub-power source lines 36, a VDD main power source line 38 and VDD sub-power source lines 40. First, the power source lines in a layer above the area in which the data input/output portions 12-1 to 12-7 and the control portion 14 are arranged will be described below.

The VSS main power source line 31 is disposed near the upper ends of the data input/output portions 12-1 to 12-7 while extending in the row direction. More specifically, the VSS main power source line 31 is disposed parallel to the power source lines 20 near the upper ends of the area in which the power source lines 20 are formed.

The VSS sub-power source lines 33 are present in the number of at least one, are connected to the VSS main power source line 31 and are arranged in the direction perpendicular to the VSS main power source line 31 (i.e., column direction) extending to the data input/output portions 12-1 to 12-7 side. In other words, the VSS sub-power source lines 33 are arranged so as to extend in a layer above the power source lines 20. The VSS sub-power source lines 33 are electrically connected to the power source lines 20 that supply the ground voltage VSS of the power source lines 20 via contacts.

The VSS sub-power source lines 35 are present in the number of at least one, are connected to the VSS main power source line 31 and are arranged in the direction perpendicular to the VSS main power source line 31 (i.e., column direction), extending to the control portion 14 side. In other words, the VSS sub-power source lines 35 are arranged so as to extend in a layer above the power source lines 21. The VSS sub-power source lines 35 are electrically connected to the power source lines 21 that supply the ground voltage VSS of the power source lines 21 via contacts.

The VDD main power source line 32 is disposed near the lower ends of the data input/output portions 12-1 to 12-7 while extending in the row direction. More specifically, the VDD main power source line 32 is disposed parallel to the power source lines 20 near the lower ends of the area in which the power source lines 20 are formed. Therefore, the VSS main power source line 31 and the VDD main power source line 32 are arranged parallel to the power source lines 20 and opposed to each other with the power source lines 20 interposed therebetween.

The VDD sub-power source lines 34 are present in the number of at least one, are connected to the VDD main power source line 32 and are arranged in the direction perpendicular to the VDD main power source line 32 (i.e., column direction), extending to the data input/output portions 12-1 to 12-7 side. In other words, the VDD sub-power source lines 34 are arranged so as to extend in a layer above the power source lines 20. The VDD sub-power source lines 34 are electrically connected to the power source lines 20 that supply the power source voltage VDD of the power source lines 20 via contacts.

The VDD sub-power source lines 36 are present in the number of at least one, are connected to the VDD main power source line 32 and are arranged in the direction perpendicular to the VDD main power source line 32 (i.e., column direction), extending to the control portion 14 side. In other words, the VDD sub-power source lines 36 are arranged so as to extend in a layer above the power source lines 21. The VDD sub-power source lines 36 are electrically connected to the power source lines 21 that supply the power source voltage VDD of the power source lines 21 via contacts.

It is preferable that the VSS sub-power source lines 33 and the VDD sub-power source lines 34 are parallel to each other and arranged alternately. More specifically, the VSS sub-power source lines 33 form a comb-shape by combining with the VSS main power source line 31, and the VDD sub-power source lines 34 form a comb-shape by combining with the VDD main power source line 32. These two comb-shaped power source lines are nested to each other. Since the VSS sub-power source lines 33 are nested between the VDD sub-power source lines 34, all of the VSS sub-power source lines 33 and the VDD sub-power source lines 34 can be connected to the power source lines 20.

It is also preferable that the VSS sub-power source lines 35 and the VDD sub-power source lines 36 are parallel to each other and arranged alternately. More specifically, the VSS sub-power source lines 35 form a comb-shape by combining with the VSS main power source line 31, and the VDD sub-power source lines 36 form a comb-shape by combining with the VDD main power source line 32. These two comb-power source lines are nested to each other. Since the VSS sub-power source lines 35 are nested between the VDD sub-power source lines 36, all of the VSS sub-power source lines 35 and the VDD sub-power source lines 36 can be connected to the power source lines 21.

It is preferable that the length of the VSS sub-power source lines 33 is longer than the gap between the M6VSS lines 1 that are adjacent with the M6VDD line 2 interposed therebetween. This ensures an electrical connection between the VSS sub-power source lines 33 and the M6VSS lines 1 in the sixth layer. When the length of the VSS sub-power source lines 33 is shorter than the gap between the M6VSS lines 1 that are adjacent with the M6VDD line 2 interposed therebetween (as shown in FIG. 5), the VSS sub-power source lines 33 cannot be connected to the M6VSS lines 1. The same can be applied to the case of the VDD sub-power source lines 34.

It is preferable that the line width of the VSS main power source line 31 and the VDD main power source line 32 are wider than that of the other power source lines in the fourth layer, as shown in FIG. 4. The data input/output portions 12-1 to 12-7 are provided with pre-charge circuits for charging bit lines arranged in the memory cell area 11. The pre-charge circuits require a stronger power source than other circuits. Therefore, as shown in FIG. 4, when the line width of the power source lines in the fourth layer for supplying a voltage to the data input/output portions 12-1 to 12-7 provided with the pre-charge circuits is large, a stronger power source can be supplied to the pre-charge circuits.

Next, the power source lines in a layer above the area in which the row decoders 13-1 to 13-5 are arranged will be described. The VSS main power source line 37 is disposed near the right ends of the row decoders 13-1 to 13-5 so as to extend in the column direction. More specifically, the VSS main power source line 37 is disposed parallel to the power source lines 22 near the right ends of the area in which the power source lines 22 are formed.

The VSS sub-power source lines 39 are present in the number of at least one, are connected to the VSS main power source line 37 and are arranged in the direction perpendicular to the VSS main power source line 37 (i.e., row direction), extending to the row decoders 13-1 to 13-5 side. In other words, the VSS sub-power source lines 39 are arranged so as to extend in a layer above the power source lines 22. The VSS sub-power source lines 39 are electrically connected to the power source lines 22 that supply the ground voltage VSS of the power source lines 22 via contacts.

The VDD main power source line 38 is disposed near the left ends of the row decoders 13-1 to 13-5 so as to extend in the column direction. More specifically, the VSS main power source line 38 is disposed parallel to the power source lines 22 near the left ends of the area in which the power source lines 22 are formed. Therefore, the VSS main power source line 37 and the VDD main power source line 38 are arranged parallel to the power source lines 22 and opposed to each other with the power source lines 22 interposed therebetween.

The VDD sub-power source lines 40 are present in the number of at least one, are connected to the VDD main power source line 38 and are arranged in the direction perpendicular to the VDD main power source line 38 (i.e., row direction), extending to the row decoders 13-1 to 13-5 side. In other words, the VDD sub-power source lines 40 are arranged so as to extend in a layer above the power source lines 22. The VDD sub-power source lines 40 are electrically connected to the power source lines 22 that supply the power source voltage VDD of the power source lines 22 via contacts.

It is preferable that the VSS sub-power source lines 39 and the VDD sub-power source lines 40 are parallel to each other and arranged alternately. The reason for this has been explained with reference to the case of the VSS sub-power source lines 33 and the VDD sub-power source lines 34 and therefore will not be described in duplicate.

It is preferable that the length of the VSS sub-power source lines 39 is longer than the gap between the M5VSS lines 3 that are adjacent with the M5VDD line 4 interposed therebetween. Similarly, it is also preferable that the length of the VDD sub-power source lines 40 is longer than the gap between the M5VDD lines 4 that are adjacent with the M5VSS line 3 interposed therebetween. The reason for this has been explained with reference to the case of the VSS sub-power source lines 33 and the VDD sub-power source lines 34 and therefore will not be described in duplicate.

Next, the power source lines in a layer above the area in which the memory cell area 11 is disposed will be described. The VSS power source lines 41 for memories are arranged in the number of at least one, and connect between the VSS power source line 42 for memories and the VSS main power source line 31. The VSS power source lines 41 for memories are arranged so as to be parallel to each other and extend in the direction perpendicular to the VSS main power source line 31. The VSS power source lines 41 for memories are lines for supplying the ground voltage VSS to memory cells in the memory cell area 11.

The VSS power source line 42 for memories is disposed so as to extend in the row direction of the memory cell area 11. In FIG. 4, the VSS power source line 42 for memories is disposed in the upper end of the memory cell area 11, but the arrangement position of the VSS power source line 42 for memories is not limited thereto. Therefore, the VSS power source line 42 for memories may be disposed so as to extend in the row direction in the vicinity of the central portion of the memory cell area 11. Providing the VSS power source line 42 for memories in this manner means that the VSS power source lines 41 for memories are connected via another line than the VSS main power source line 31. Consequently, the voltage of the VSS power source lines 41 for memories can be stable.

In the memory cell area 11, the power source lines for supplying the power source voltage VDD are arranged in the second layer, and not in the fourth layer. This is because that it is preferable that the ground voltage VSS is larger than the power source voltage VDD in the memory cell area 11 of SRAM. The reason for this will be described below.

In the operation of a memory cell, a pre-charge transistor that is present in a peripheral circuit brings a bit line back to a high potential level. Therefore, the power source of the power source voltage VDD only has to have an ability to drive a current for rewriting data in that memory cell by keeping one of two nodes in the memory cell in the high level, or by generating an inverse signal when a bit line is turned to the low level at the time of writing. Therefore, the power source of the power source voltage VDD does not require a power system as strong as the power source of the ground voltage VSS, which is connected to N-channel transistors of memory cells, which perform an operation of discharging bit lines.

A connection between the thus configured memory circuit 5, which is an example of the semiconductor device of this embodiment, and the power source lines in the fifth layer will be described with reference to the accompanying drawing. FIG. 6 is a diagram showing a connection relationship between the power source lines in the fifth layer and the power source lines in the fourth layer. The reference numerals for the power source lines in the fourth layer are not shown.

In FIG. 6, the M5VSS lines 3 and the M5VDD lines 4 are arranged so as to be parallel to each other and extend in the column direction. The M5VSS lines 3 are lines for supplying the ground voltage VSS, and therefore have to be connected to the power source lines for supplying the ground voltage VSS of the power source lines in the fourth layer. In FIG. 6, the power source lines for supplying the ground voltage VSS are denoted by black lines. Therefore, the M5VSS lines 3 are connected to these power source lines in the fourth layer via contacts in the points in which the M5VSS lines 3 perpendicularly cross these power source lines in the fourth layer when the semiconductor chip is projected from above. In FIG. 6, the M5VSS lines 3 are connected to the power source lines in the fourth layer in the portions enclosed by a circle (including an ellipse).

Since the M5VDD lines 4 are power source lines for supplying the power source voltage VDD, the M5VDD lines 4 have to be connected to power source lines that supply the power source voltage VDD of the power source lines in the fourth layer. The power source lines that supply the power source voltage VDD in the fourth layer are denoted by gray lines in the drawing. Therefore, the M5VDD lines 4 are connected to these power source lines in the fourth layer via contacts in the points in which the M5VDD lines 4 perpendicularly cross these power source lines in the fourth layer when the semiconductor chip is projected from above. In FIG. 6, the M5VDD lines 4 are connected to the power source lines in the fourth layer in the portions enclosed by a square. In this manner, the power source lines in the fourth layer are electrically connected to the power source lines in the fifth layer.

The memory circuit 5 may be disposed with being rotated by 90 degrees with respect to the state of FIG. 2. The connection between the power source lines in the fourth layer and the power source lines in the fifth layer when the memory circuit 5 is disposed with being rotated by 90 degrees will be described with reference to the accompanying drawing. FIG. 7 is a diagram showing a connection relationship between the power source lines in the fifth layer and the power source lines in the fourth layer. The reference numerals for the power source lines in the fourth are not shown.

As shown in FIG. 7, the power source lines in the fourth layer and the power source lines in the fifth layer are electrically connected via contacts at the points in which they cross perpendicularly to each other when the semiconductor chip is projected from above. More specifically, in FIG. 7, the power source lines in the fourth layer for supplying the ground voltage VSS are electrically connected to the M5VSS lines 3 via contacts at the portion enclosed by an ellipse. In FIG. 7, the power source lines in the fourth layer for supplying the power source voltage VDD are electrically connected the M5VDD lines 4 via contacts at the portions enclosed by a square. The connection between the power source lines in the fourth layer and the power source lines in the fifth layer in FIG. 7 is basically the same as the connection between the power source lines in the fourth layer and the power source lines in the fifth layer in FIG. 6, and therefore is not described further in detail.

As described above, according to the semiconductor device of this embodiment, the degree of freedom of the design of the power source lines arranged in a semiconductor device can be increased. Hereinafter, this will be described in detail.

In a conventional semiconductor device, as shown in FIG. 16, the circuit from the first to the sixth layers is prepared in a library and is used. Therefore, guiding as shown in FIG. 17 is required in order to connect the power source lines in the fifth and sixth layers on the circuit of FIG. 16 to the power source lines in the fifth and sixth layers around the periphery of the circuit of FIG. 16. Consequently, it is necessary to design the power source lines in the fifth and the sixth layers in consideration with the connection relationship with the power source lines in the fifth and sixth layers of the circuit of FIG. 16.

On the other hand, in the semiconductor device of this embodiment, a semiconductor device from the first layer to the fourth layer is prepared in a library as a memory macro. The semiconductor device up to the fourth layer is disposed as a memory macro, and the power source lines in the fifth and sixth layer are provided in the chip level. Finally, the power source lines in the fourth layer and the power source lines in the fifth layer are electrically connected at the points in which they cross each other as shown in FIGS. 6 and 7, and the layout in the chip level is created. In this case, the power source lines in the fourth layer include both the power source lines extending in the column direction and the power source lines extending in the row direction in each portion of the semiconductor device. Therefore, at least one of the power source lines in the fourth layer perpendicularly crosses the power source lines in the fifth layer. As a result, it is possible to design the power source lines in the fifth layer without considering the connection relationship between the power source lines in the fourth layer and the power source lines in the fifth layer. That is to say, the degree of freedom of the design of the power source lines in the fifth layer can be increased.

Furthermore, according to the semiconductor device of this embodiment, the chip area can be reduced from that of the conventional semiconductor device. Hereinafter, this will be described in detail with reference to the accompanying drawing.

Figure 8:
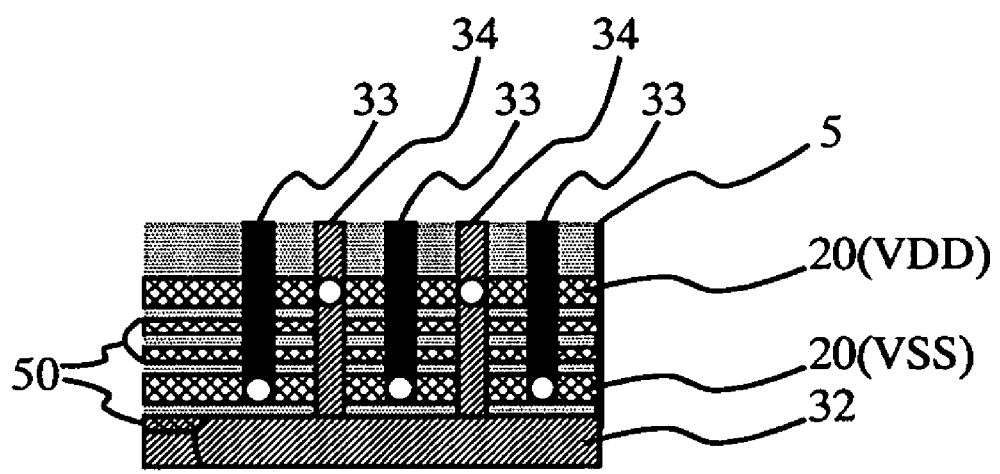
FIG. 8 is a diagram showing the connection relationship between the power source lines in the fourth layer and the lines in the third layer in a portion β in FIG. 2.

FIG. 8 is a diagram showing the connection relationship between the power source lines in the fourth layer and the lines in the third layer in a portion β in FIG. 2.

Figure 18:
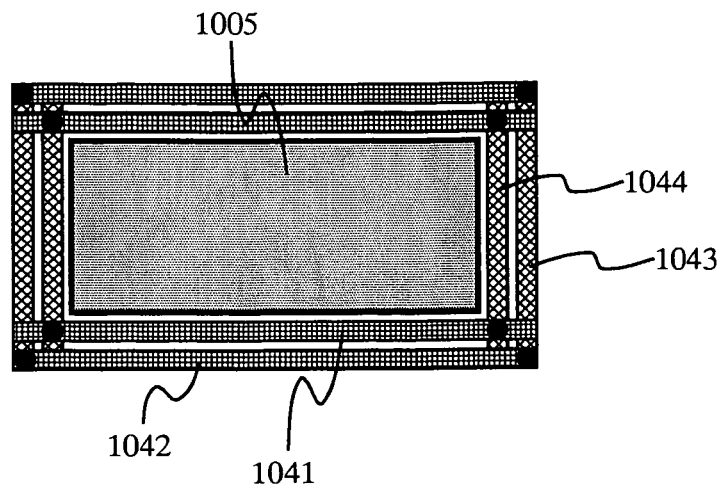
FIG. 18 is a diagram showing the configuration of a semiconductor device including a memory circuit.
Figure 19:
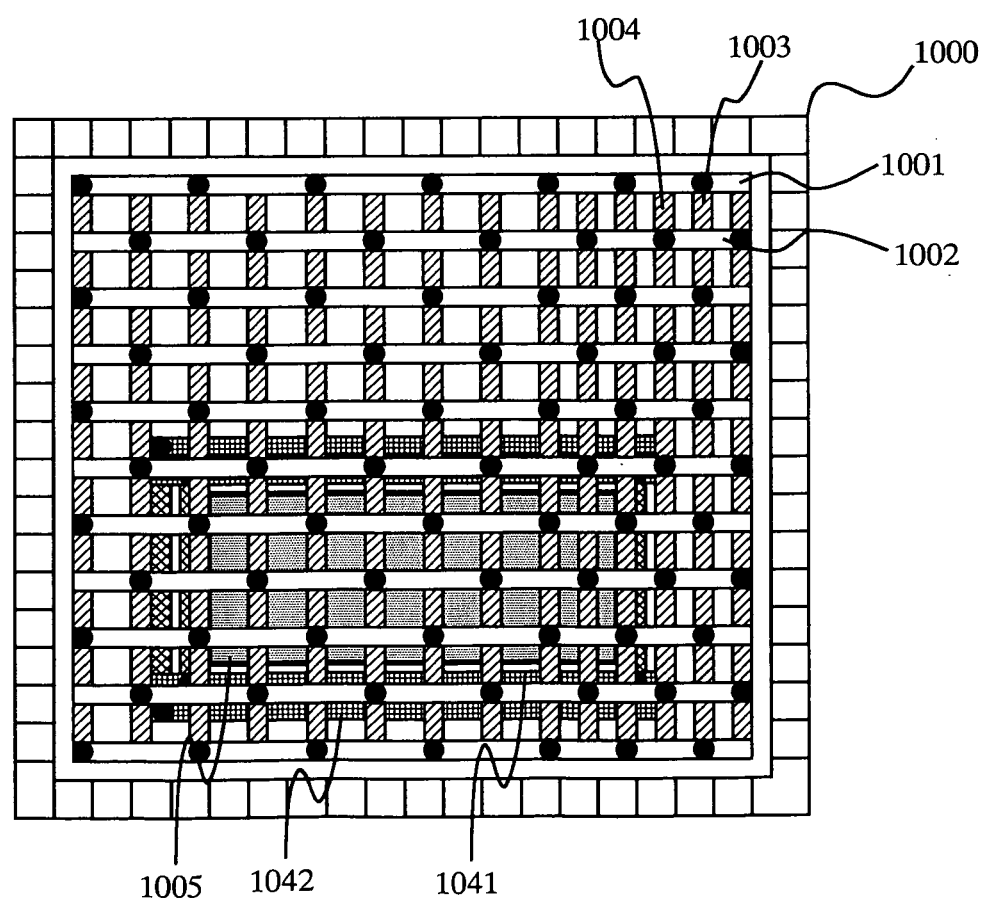
FIG. 19 is a diagram showing a semiconductor chip to which the semiconductor device including a memory circuit shown in FIG. 18 is applied.
Figure 20:
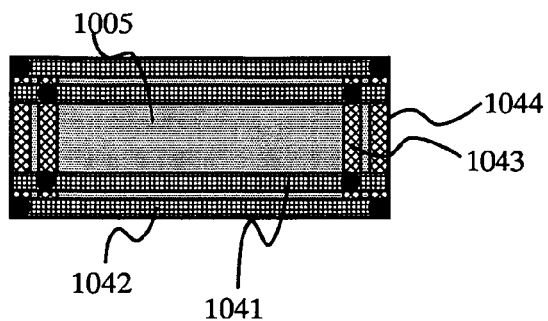
FIG. 20 is a diagram showing the configuration of a semiconductor device including a memory circuit.
Figure 21:
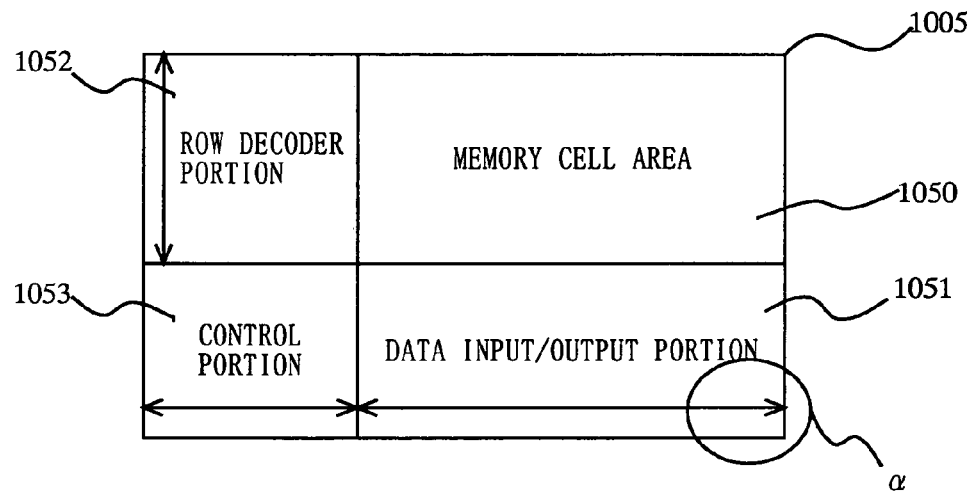
FIG. 21 is a block diagram showing the configuration of a memory circuit 1005.

Conventionally, as shown in FIG. 18, two types of power source lines, that is, the M4VSS line 1041 and the M4VDD line 1042, in the fourth layer were arranged around the periphery of the memory circuit 1005. On the other hand, in the semiconductor device of this embodiment, two power source lines for two types of voltages are arranged so as to be nested to each other in the fourth layer, as shown in FIG. 4. Therefore, only the power source lines for supplying the power source voltage VDD are arranged in an area around the periphery of the memory circuit 5 in the fourth layer. Consequently, the semiconductor device of this embodiment makes it possible to reduce the size of the circuit of the semiconductor device.

Figure 22:
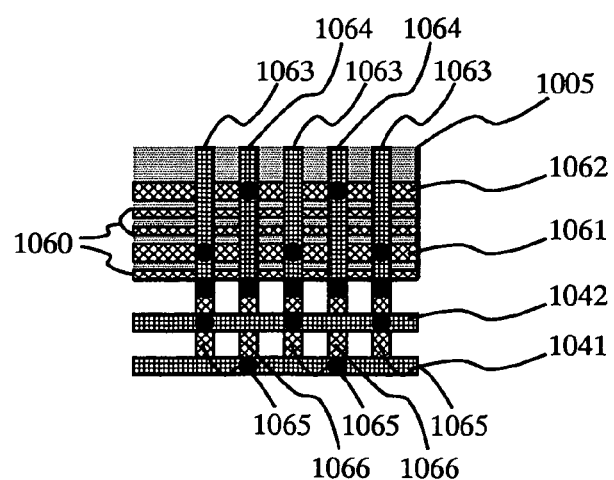
FIG. 22 is a diagram showing an enlarged portion α of FIG. 21.

Furthermore, conventionally, in the circuit shown in FIG. 18, in order to connect the two types of power source lines, that is, the M4VSS line 1041 and the M4VDD line 1042, with the lines in the memory circuit 1005, the power source lines have to extend in the third layer below the M4VDD line 1042, as shown in FIG. 22. Therefore, the M4VSS line 1041 and the M4VDD line 1042 cannot be arranged above the memory circuit 1005.

On the other hand, in the semiconductor device of this embodiment, as shown in FIG. 4, the two power source lines do not extend around the periphery of the memory circuit 5. Therefore, as shown in FIG. 8, it is not necessary for the power source lines to extend in the layer below the power source lines in the fourth layer in order to connect the power source lines in the fourth layer and the power source lines in the third layer within the memory circuit 5. Therefore, at least a portion of the VDD main power source line 32 can be surmounted on the memory circuit 5. Consequently, the semiconductor device of this embodiment makes it possible to reduce the size of the circuit of the semiconductor device.

Figure 9:
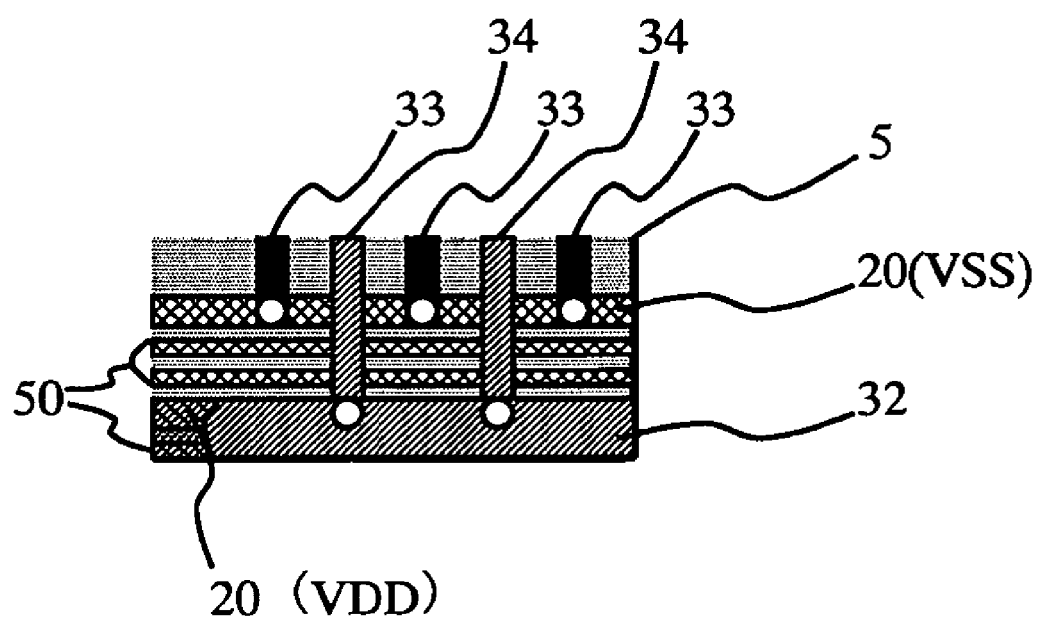
FIG. 9 is a diagram showing the connection relationship between the power source lines in the fourth layer and the lines in the third layer in a portion β in FIG. 2.

In the memory circuit 5, P-channel transistors are arranged in the outer circumference, and N-channel transistors are arranged in the inner circumference, so that the size of the memory circuit 5 can be smaller than that of FIG. 8. Hereinafter, this will be described in detail with reference to the accompanying drawing. FIG. 9 is a diagram showing the connection relationship between the power source lines in the fourth layer and the lines in the third layer in a portion β in FIG. 2.

The P-channel transistors require the power source voltage VDD and N-channel transistors require the ground voltage VSS. Therefore, in the third layer in an outer circumference of the memory circuit 5 in which the P-channel transistors are arranged, it is necessary to dispose the power source line 20 for supplying the power source voltage VDD. Furthermore, in the third layer in an inner circumference of the memory circuit 5 in which the N-channel transistors are arranged, it is necessary to dispose the power source line 20 for supplying the ground voltage VSS.

Therefore, as shown in FIG. 9, the power source line 20 in the third layer for supplying the power source voltage VDD is disposed in the outer circumference side of the memory circuit 5, and the power source line 20 in the third layer for supplying the ground voltage VSS is disposed in the inner circumference side of the memory circuit 5. Furthermore, the VDD main power source line 32 and the power source line 20 for supplying the power source voltage VDD are connected via contacts. Thus, the VDD main power source line 32 can be disposed on the memory circuit 5, so that the chip area of the memory circuit 5 can be reduced further.

The semiconductor device of this embodiment can provide a higher degree of freedom in a method for disposing a semiconductor device. More specifically, in the semiconductor device of this embodiment, as shown in FIG. 4, both the power source lines in the column direction and the power source lines in the row direction are present in each portion (e.g., the data input/output portions 12 or the row decoders 13) in the fourth layer in the semiconductor device. Therefore, this embodiment ensures the points at which the power source lines in the fourth layer and the power source lines in the fifth layer are connected, as shown in FIG. 7, even if the semiconductor device is rotated with 90 degrees.

In an SRAM that is an example of the semiconductor device of this embodiment, it is preferable that bit lines and power source lines for supplying the power source voltage VDD are arranged in the second layer, that word lines are arranged in the third layer, and that power source lines for supplying the ground voltage VSS are arranged in the fourth layer.

In the semiconductor device of this embodiment, it is preferable that the lengths of the VSS main power source line 31 and the length of the VSS main power source line 37 shown in FIG. 4 are longer than the gap between the M5VSS lines 3 that are adjacent with the M5VDD line 4 interposed therebetween. Similarly, it is preferable that the lengths of the VDD main power source line 32 and the length of the VDD main power source line 38 are longer than the gap between M5VDD lines 4 that are adjacent with the M5VSS line 3 interposed therebetween. The reason for this has been described with reference to FIG. 5. This is the same as the limitation of the length of the VSS sub-power source lines 33 and the length of the VDD sub-power source lines 34 and therefore will not be described in detail in duplicate.

The semiconductor device of this embodiment may be another circuit than a memory circuit.

Figure 10:
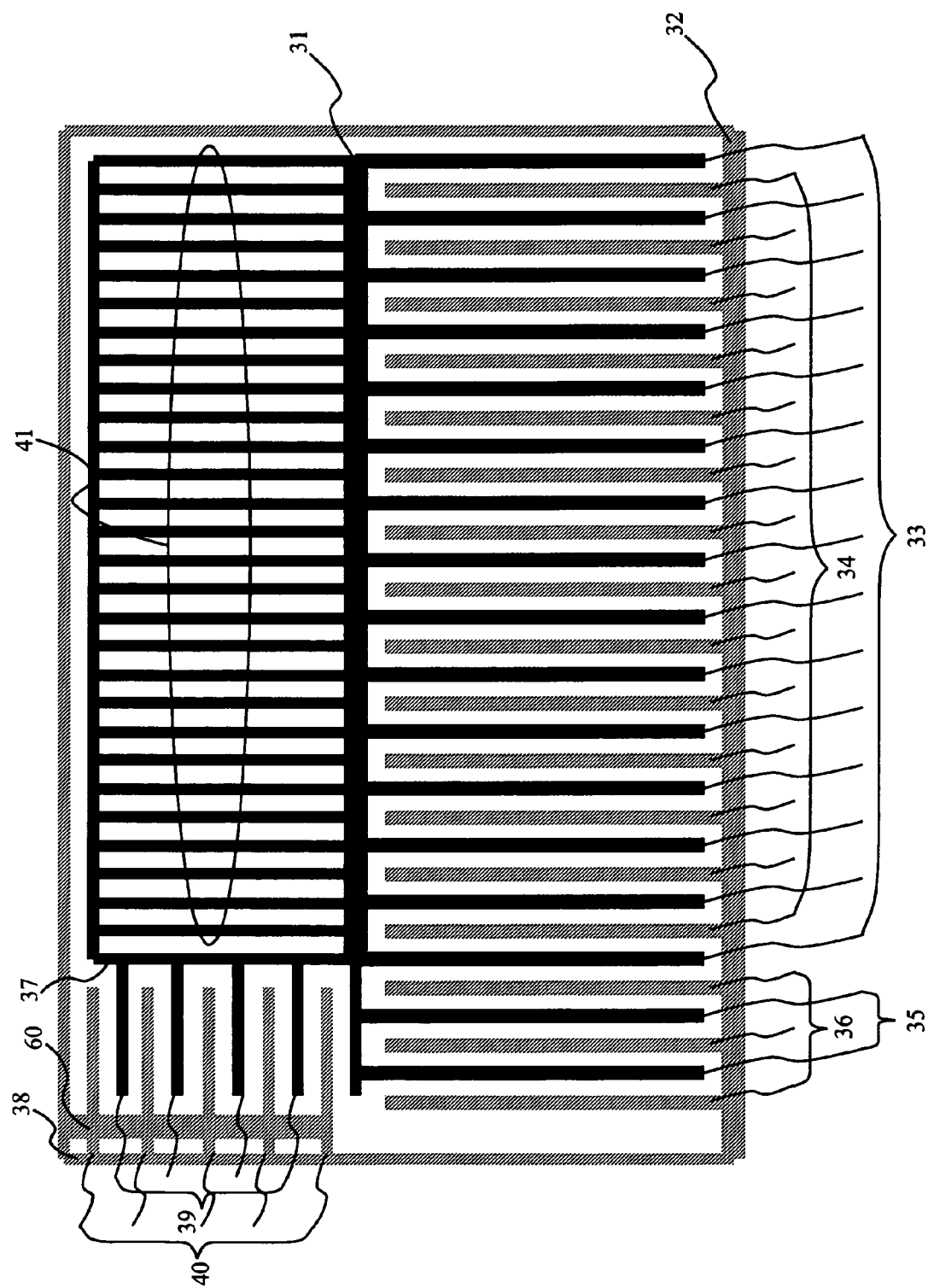
FIG. 10 is a diagram showing another example of the power source lines in the fourth layer of the memory circuit 5.

As shown in FIG. 10, a VDD main power source line 60 extending in the column direction in the fourth layer may be further provided. Thus, even if signal lines are arranged in both a layer above and a layer below the area in which the VDD main power source line 60 is disposed, malfunction of the row decoders 13 or other elements due to coupling noise occurring between these signal lines can be prevented. Hereinafter, this will be described in detail with reference to FIG. 10.

In the row decoders 13-1 to 13-5, row pre-decode signal lines are arranged in the row direction in the third layer near the left end of FIG. 10 in the third layer. Since the row pre-decode signal lines are signal lines, they are particularly susceptible to noise. The VDD main power source line 60 is formed in a layer above the area in which row pre-decode signal lines are arranged. More specifically, the VDD main power source line 60 is disposed so as to be parallel to the VDD main power source line 38 and cover the row pre-decode signal lines. Thus, the row pre-decode signal lines are shielded from an electrostatic field by the VDD main power source line 60. Consequently, malfunction of the row decoders 13 or other elements due to coupling noise can be prevented.

In this embodiment, the memory circuit of a side decode system in which row decoders are arranged in the left end has been described as an example of the semiconductor device. However, the position in which the row decoders are arranged is not limited thereto. Hereinafter, a memory circuit of the center decode system in which row decoders are provided near the central column in the memory circuit will be described as another example of the semiconductor device.

Figure 11:
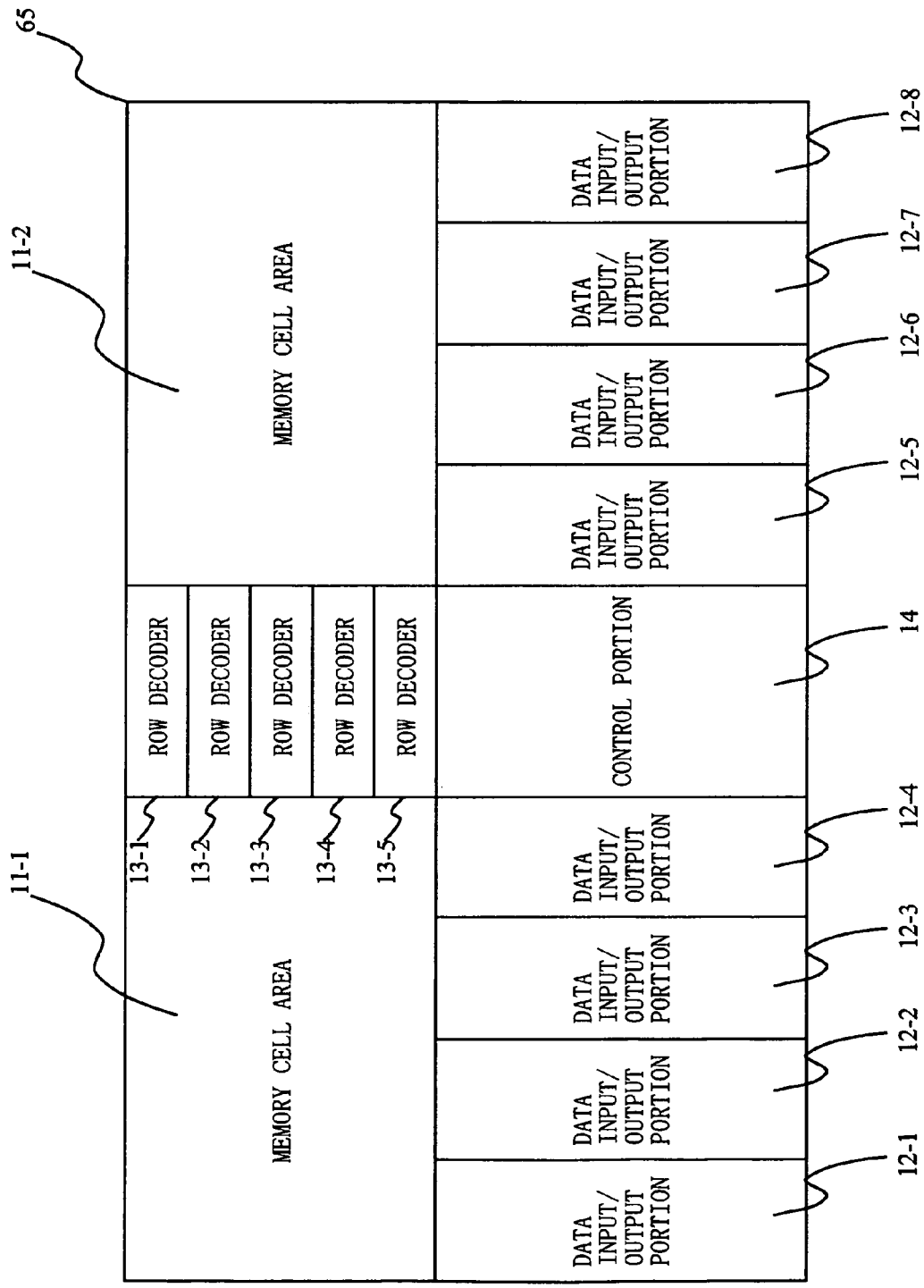
FIG. 11 is a block diagram showing the function of each portion in the memory circuit 65 of a center decode system.

Hereinafter, a memory circuit of the center decode system will be described with reference to the accompanying drawing. FIG. 11 is a block diagram showing the function of each portion in a memory circuit 65 of the center decode system.

As shown in FIG. 11, the memory circuit 65 of the center decode system includes memory cell areas 11-1 and 11-2, data input/output portions 12-1 to 12-8, row decoders 13-1 to 13-5 and a control portion 14. In the memory circuit 65, unlike the memory circuit 5 of the side decode system of FIG. 2, the row decoders 13-1 to 13-5 and the control portion 14 are arranged in a line in the vicinity of the center of the memory circuit.

Figure 12:
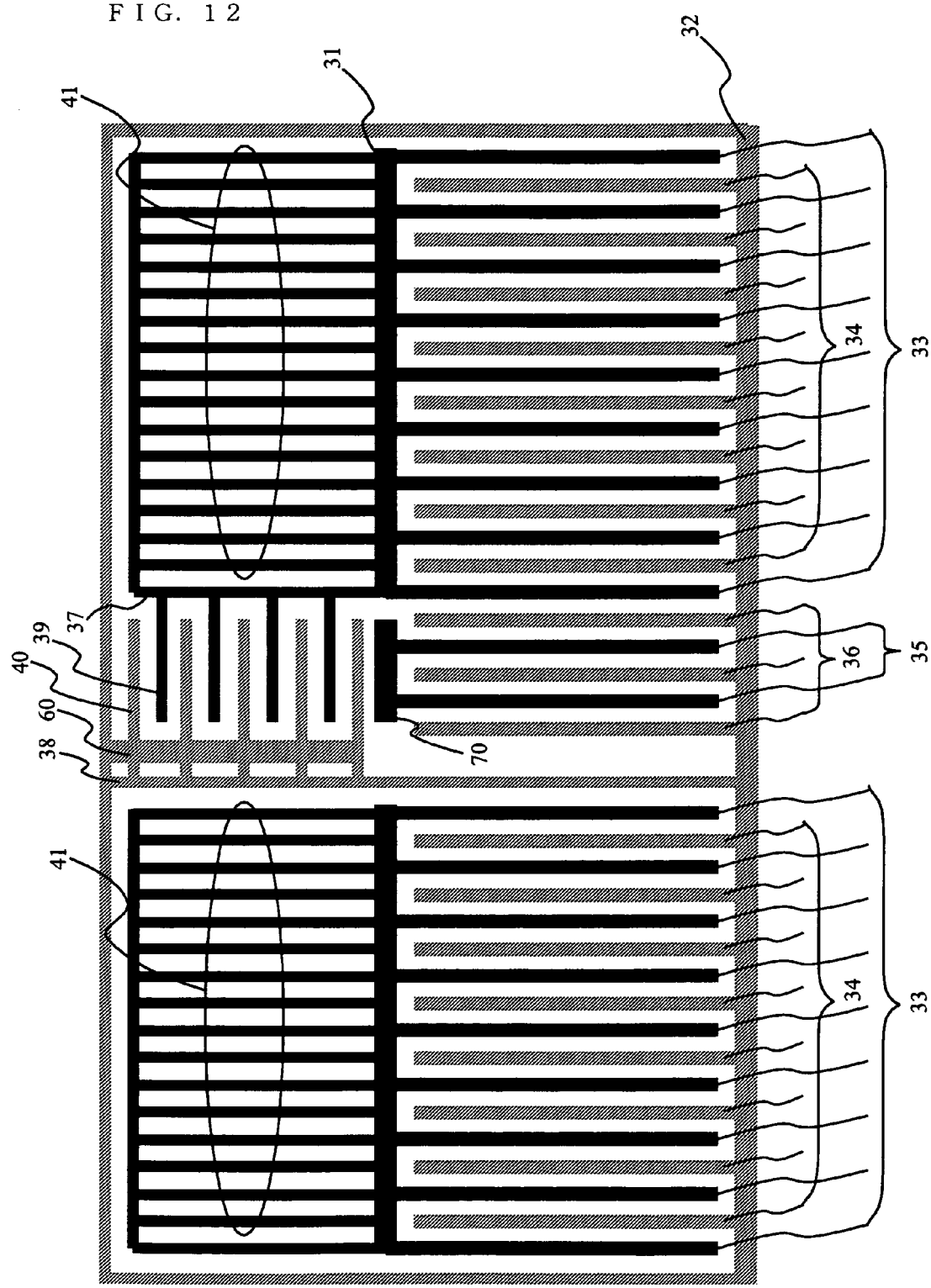
FIG. 12 is a diagram showing an example of the configuration of the power source lines in the fourth layer of the memory circuit 65.

Hereinafter, the configuration of the power source lines in the fourth layer of the memory circuit 65 of the center decode system will be described with reference to the accompanying drawing. FIG. 12 is a diagram showing an example of the configuration of the power source lines in the fourth layer of the memory circuit 65.

In the memory circuit 65 of the center decode system as shown in FIG. 11, as shown in FIG. 12, a VDD main power source line 38 is disposed so as to extend from the upper end to the lower end of the memory circuit 65 in the column direction. Thus, it is ensured that the power source lines in the fifth layer and the VDD main power source line 38 cross each other, even if the power source lines in the fifth layer are arranged in the row direction. Consequently, it is ensured that the power source voltage VDD can be supplied to the row decoders 13-1 to 13-5.

Figure 13:
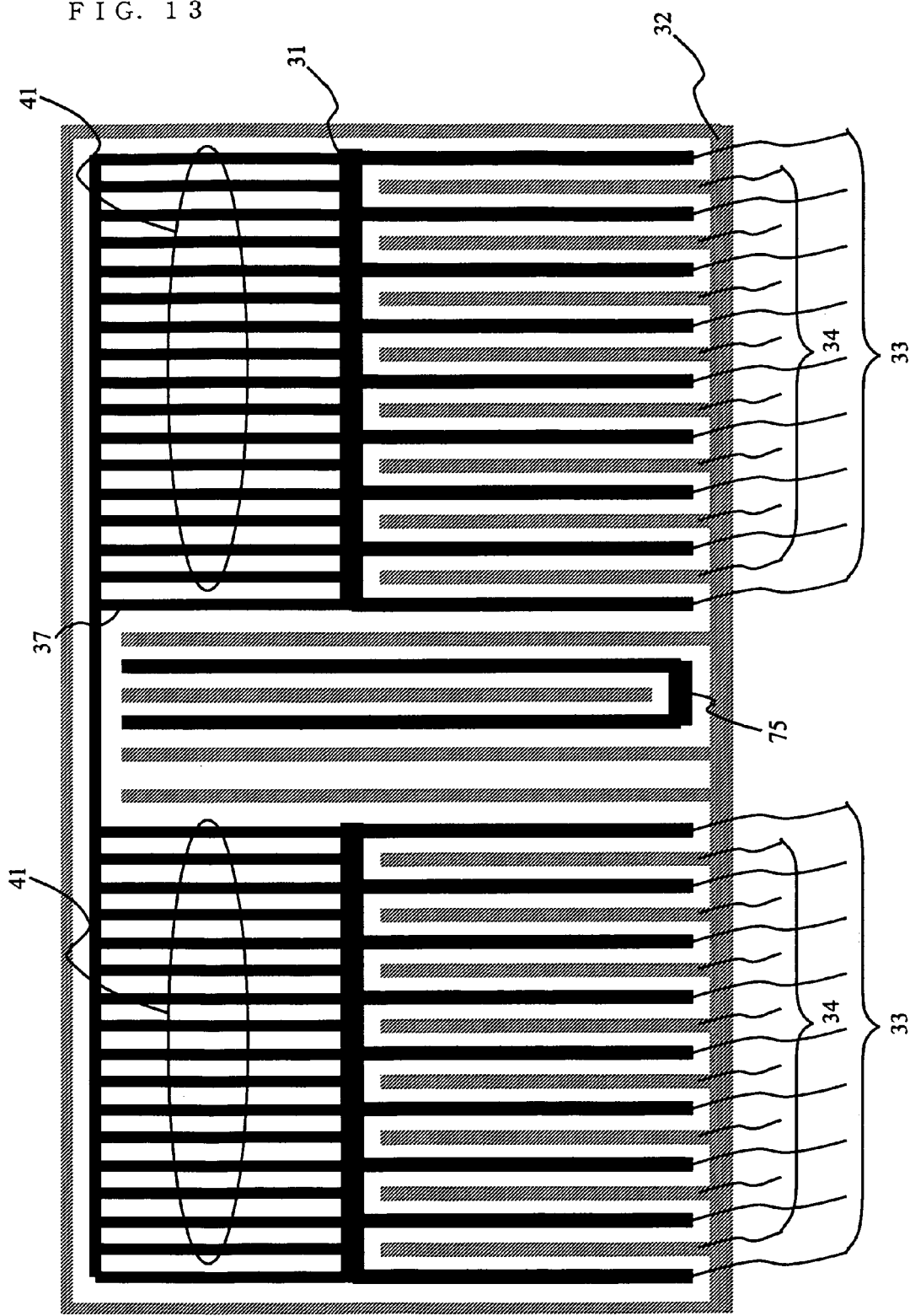
FIG. 13 is a diagram showing an example of the configuration of the power source lines in the fourth layer of the memory circuit 65.

Alternatively, the configuration of the power source lines in the fourth layer of the memory circuit 65 of the center decode system may be one shown in FIG. 13. More specifically, the power source lines for supplying the power source voltage VDD and the power source lines for supplying the ground voltage VSS are arranged parallel to each other while extending in the column direction in the area above the row decoders 13-1 to 13-5 and the control portion 14. The power source lines for supplying the power source voltage VDD are connected to the VDD main power source line 32 disposed at the lower end of the memory circuit 65. The power source lines for supplying the ground voltage VSS are connected to a power source line 75 for the ground voltage VSS extending in the row direction. It is preferable that the power source line 75 is longer than the gap between the power source lines in the fifth layer. This makes it possible to ensure a connection between the power source lines in the fourth layer and the power source lines in the fifth layer.

Figure 14:
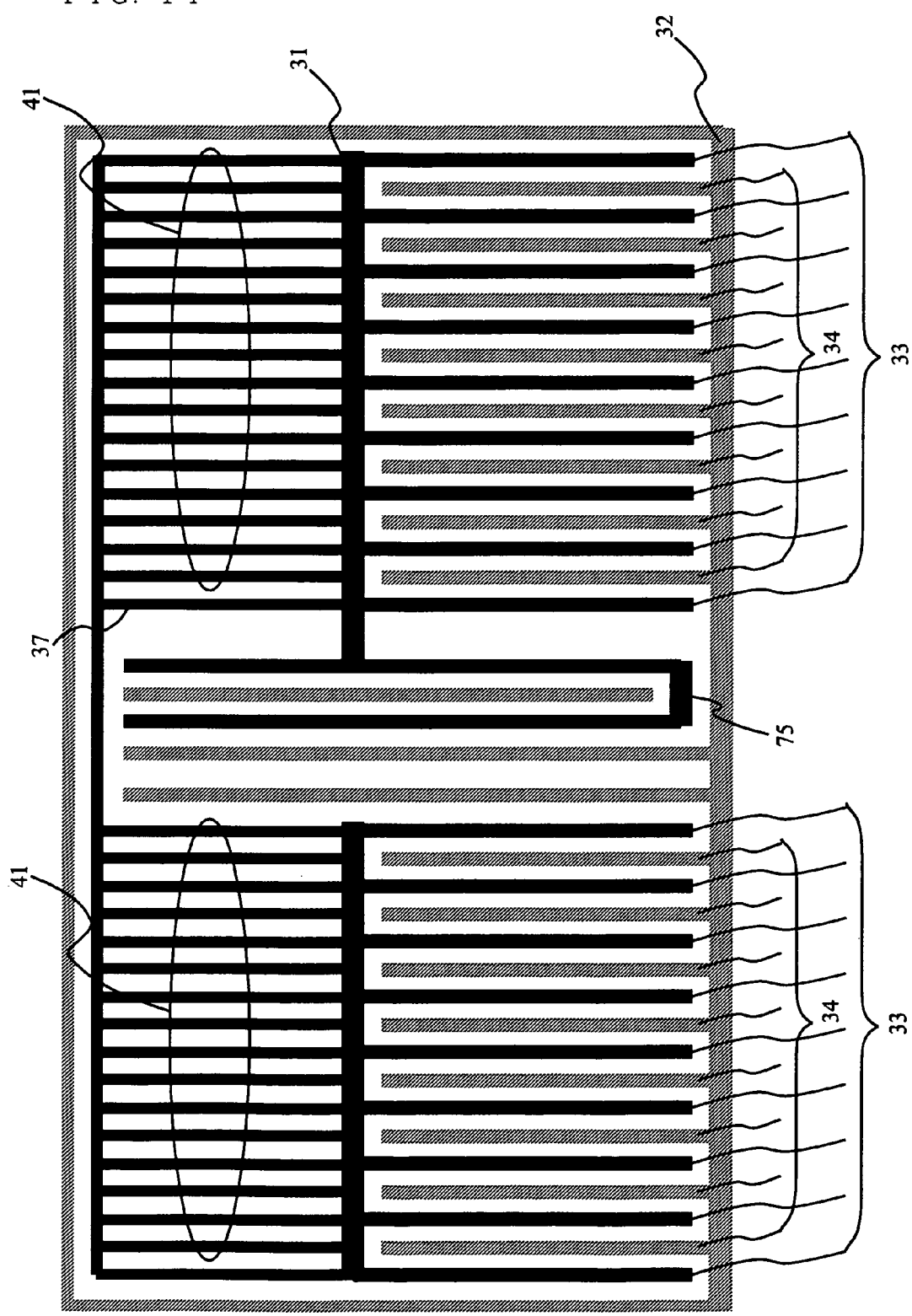
FIG. 14 is a diagram showing another example of the configuration of the power source lines in the fourth layer of the memory circuit 65.

Alternatively, the configuration of the power source lines in the fourth layer of the memory circuit 65 of the center decode system may be one shown in FIG. 14. In the configuration of the power source lines shown in FIG. 14, power source lines for supplying the ground voltage VSS arranged so as to extend in the column direction and the VSS main power source line 31 are connected in the area above the row decoders 13-1 to 13-5 and the control portion 14. This makes it possible to supply a stronger power to the row decoders 13-1 to 13-5 and the control portion 14.

While the invention has been described in detail, the foregoing description is in all aspects illustrative and not restrictive. It is understood that numerous other modifications and variations can be devised without departing from the scope of the invention.

What is claimed is:

1. A semiconductor device that is incorporated into a portion of a semiconductor integrated circuit in which a plurality of first power source lines to which a first voltage is applied and a plurality of second power source lines to which a second voltage is applied are arranged in a lattice, comprising:

an internal circuit that is disposed in a layer below the first and the second power source lines and operates with the first and the second voltages supplied;

first internal power source lines arranged parallel to each other in a layer between a layer in which the first power source lines are arranged and a layer in which the internal circuit is disposed in order to supply the first voltage to the internal circuit;

second internal power source lines arranged parallel to the first internal power source lines in a same layer as the first internal power source lines in order to supply the second voltage to the internal circuit;

first and second lines arranged parallel to the first and the second internal power source lines in a layer between the layer in which the first and the second internal power source lines are arranged and the layer in which the first and the second power source lines are arranged;

a plurality of third lines that are connected to the first line and extend in a direction perpendicular to the first line above an area in which the first and second internal power source lines are present; and a plurality of fourth lines that are connected to the second line and extend in a direction perpendicular to the second line above the area in which the first and the second internal power source lines are present, wherein the first line, the third lines and the first internal power source lines are electrically connected, and the second line, the fourth lines and the second internal power source lines are electrically connected.

2. The semiconductor device according to claim 1, further comprising a memory cell area in which a plurality of memory cells are arranged in a matrix, wherein the internal circuit includes a peripheral circuit for writing and reading data in/from the memory cells.

3. The semiconductor device according to claim 2, wherein the peripheral circuit comprises:
an input/output circuit for inputting/outputting data with respect to the memory cells;
a row decoder circuit for selecting memory cells in the memory cell area row by row; and
a control circuit for controlling the input/output circuit and the row decoder circuit.

4. The semiconductor device according to claim 3, wherein a line width of the first line disposed in a layer above an area in which the input/output circuit is present is larger than that of the first line disposed in a layer above an area in which the row decoder circuit and the memory cell area are present.

5. The semiconductor device according to claim 3, wherein a line width of the second line disposed in a layer above a vicinity of a boundary area between the input/output circuit and the memory cell area is larger than that of the second line disposed in a layer above an area in which the row decoder circuit and the memory cell area are present.

6. The semiconductor device according to claim 3, wherein the first line is disposed in a layer above an area in which the input/output circuit is present, and is connected to the first internal power source lines via contacts.

7. The semiconductor device according to claim 3, wherein a gap between the first power source lines is smaller than the shortest line of the third line disposed in the input/output circuit, the fourth line disposed in the input/output circuit, the fourth line disposed in the control circuit, and the third line disposed in the row decode circuit.

8. The semiconductor device according to claim 3, wherein a gap between the second power source lines is smaller than the shortest line of the third line disposed in the input/output circuit, the fourth line disposed in the input/output circuit, the fourth line disposed in the control circuit, and the third line disposed in the row decode circuit.

9. The semiconductor device according to claim 2, wherein the first voltage is a power source voltage and the second voltage is a ground voltage.

10. The semiconductor device according to claim 2, wherein the first line is disposed near an outer circumference of an area obtained by combining the peripheral circuit and the memory cell area, and
a P-channel transistor is formed in an area near an outer circumference of the peripheral circuit, and an N-channel transistor is formed in an area inside the area in which the P-channel transistor is formed, and
the first line is disposed in a layer above the area in which the P-channel transistor is formed, and the second line is disposed in a layer above the area in which the N-channel transistor is formed.

11. The semiconductor device according to claim 2, further comprising a plurality of lines for memory cells extending in parallel to each other in a direction perpendicular to the second line in a layer above the memory cell area.

12. The semiconductor device according to claim 1, wherein the first power source lines and the first line are electrically connected at at least one point in which they cross each other when a semiconductor chip is projected from above, and
the second power source lines and the second line are electrically connected at at least one point in which they cross each other when the semiconductor chip is projected from above.

13. The semiconductor device according to claim 1, wherein the first power source lines and the second power source lines are arranged parallel to each other and alternately, and
a length of the third lines is larger than a gap between the first power source lines that are adjacent with the second power source line interposed therebetween.

14. The semiconductor device according to claim 1, wherein the first power source lines and the second power source lines are arranged parallel to each other and alternately, and
a length of the fourth lines is larger than a gap between the second power source lines that are adjacent with the first power source line interposed therebetween.

15. The semiconductor device according to claim 1, wherein the first power source lines and the second power source lines are arranged parallel to each other and alternately, and
a length of the first line is larger than a gap between the first power source lines that are adjacent with the second power source line interposed therebetween.

16. The semiconductor device according to claim 1, wherein the first power source lines and the second power source lines are arranged parallel to each other and alternately, and
a length of the second line is larger than a gap between the second power source lines that are adjacent with the first power source line interposed therebetween.

17. The semiconductor device according to claim 1, wherein the third lines and the fourth lines are arranged parallel to each other and alternately.

18. The semiconductor device according to claim 1, further comprising:
at least one signal line arranged parallel to the first and the second internal power source lines near an end portion of the first and the second internal power source lines in a same layer as a layer in which the first and the second internal power source lines are arranged; and
a fifth line that is parallel to the first line and is connected to the third lines, the fifth line being in a layer above the area in which the signal line is present.

* * * * *